(12) United States Patent
Foster et al.

(10) Patent No.: US 11,230,667 B2
(45) Date of Patent: Jan. 25, 2022

(54) GARNET SCINTILLATOR CO-DOPED WITH MONOVALENT ION

(71) Applicant: University of Tennessee Research Foundation, Knoxville, TN (US)

(72) Inventors: Camera Janelle Foster, Knoxville, TN (US); Yuntao Wu, Knoxville, TN (US); Merry A. Koschan, Knoxville, TN (US); Charles L. Melcher, Oak Ridge, TN (US)

(73) Assignee: University of Tennessee Research Foundation, Knoxville, TN (US)

(*) Notice: Subject to any disclaimer, the term of this patent is extended or adjusted under 35 U.S.C. 154(b) by 0 days.

(21) Appl. No.: 16/612,534

(22) PCT Filed: Feb. 7, 2019

(86) PCT No.: PCT/US2019/016965
§ 371 (c)(1),
(2) Date: Nov. 11, 2019

(87) PCT Pub. No.: WO2019/157126
PCT Pub. Date: Aug. 15, 2019

(65) Prior Publication Data
US 2020/0362238 A1   Nov. 19, 2020

Related U.S. Application Data

(60) Provisional application No. 62/672,890, filed on May 17, 2018, provisional application No. 62/627,399, filed on Feb. 7, 2018.

(51) Int. Cl.
C09K 11/77 (2006.01)
C30B 15/04 (2006.01)
(Continued)

(52) U.S. Cl.
CPC .......... *C09K 11/7774* (2013.01); *C30B 15/04* (2013.01); *C30B 29/22* (2013.01); *G01T 1/2018* (2013.01)

(58) Field of Classification Search
None
See application file for complete search history.

(56) References Cited

U.S. PATENT DOCUMENTS 9,624,429 B2   4/2017   Stand et al.
9,695,356 B1   7/2017   Stand et al.
(Continued)

FOREIGN PATENT DOCUMENTS

CA   3059126 A1   8/2019
CN   101084329 A   12/2007
(Continued)

OTHER PUBLICATIONS

Drozdowski et al. "33000 photons per MeV from mixed (Lu0.75Y0.25)3 A15O12 : Pr scintillator crystals," Optical Materials Express, vol. 4, No. 6, pp. 1207-1212 (2014).
(Continued)

*Primary Examiner* — Edwin C Gunberg
(74) *Attorney, Agent, or Firm* — Jenkins, Wilson, Taylor & Hunt, P.A.

(57) ABSTRACT

Codoped rare earth garnet-type oxide scintillators are described. More particularly, the scintillators include lutetium yttrium aluminum garnet (LuYAG)-type materials that are doped with an activator, such as praseodymium, and codoped with a monovalent cation, such as lithium. Radiation detectors comprising the scintillators, methods of detecting higher energy radiation using the scintillators, and methods of preparing the scintillators and altering scintillator properties are also described.

25 Claims, 10 Drawing Sheets

(51) Int. Cl.
*C30B 29/22* (2006.01)
*G01T 1/20* (2006.01)

(56) References Cited

U.S. PATENT DOCUMENTS

| | | |
|---|---|---|
| 10,221,355 B2 | 3/2019 | Stand et al. |
| 10,591,617 B2 | 3/2020 | Wu et al. |
| 2008/0213151 A1 | 9/2008 | Yoshikawa et al. |
| 2013/0034715 A1 | 2/2013 | Peng et al. |
| 2015/0284630 A1 | 10/2015 | Zhou et al. |
| 2015/0353822 A1 | 12/2015 | Tyagi et al. |
| 2016/0024421 A1 | 1/2016 | Qu et al. |
| 2016/0124094 A1 | 5/2016 | Melcher et al. |
| 2016/0168458 A1 | 6/2016 | Stand et al. |
| 2016/0215211 A1 | 7/2016 | Limburg |
| 2017/0044433 A1 | 2/2017 | Kamada et al. |
| 2017/0190969 A1 | 7/2017 | Stand et al. |
| 2017/0260448 A1 | 9/2017 | Cherepy et al. |
| 2018/0105745 A1 | 4/2018 | Stand et al. |
| 2018/0155620 A1 | 6/2018 | Stand et al. |
| 2018/0321393 A1 | 11/2018 | Wu et al. |
| 2019/0250286 A1 | 8/2019 | Wu et al. |
| 2020/0318006 A1 | 10/2020 | Wu et al. |
| 2021/0253952 A1 | 8/2021 | Rutstrom et al. |

FOREIGN PATENT DOCUMENTS

| | | | |
|---|---|---|---|
| CN | 101654807 A | 2/2010 | |
| CN | 101694862 A | 4/2010 | |
| CN | 102888652 A | 1/2013 | |
| CN | 102888653 A | 1/2013 | |
| CN | 106154302 A | 11/2016 | |
| CN | 106459758 A | 2/2017 | |
| CN | 106588012 A | 4/2017 | |
| EP | 1816241 A1 | 8/2007 | |
| EP | 3138891 A1 | 3/2017 | |
| JP | 2010-235388 A | 10/2010 | |
| JP | 2012-046642 A | 3/2012 | |
| JP | 2013-040274 A | 2/2013 | |
| JP | 2020527611 A | 9/2020 | |
| JP | 6971327 B2 | 11/2021 | |
| RU | 2007121448 A | 12/2008 | |
| RU | 2016146155 A | 6/2018 | |
| RU | 2019135031 A | 4/2021 | |
| TW | 200630463 A | 9/2006 | |
| WO | WO 2006/049284 A1 | 5/2006 | |
| WO | WO 2015/166999 A1 | 11/2015 | |

OTHER PUBLICATIONS

Extended European Search Report corresponding to European Patent Application No. 19750719.7-1105 dated Oct. 26, 2020.
International Search Report corresponding to International Application No. PCT/US2019/016965 dated May 23, 2019.
IPRP and Written Opinion corresponding to International Application No. PCT/US2019/016965 dated Aug. 11, 2020.
Japanese Office Action corresponding to Japanese Application No. 2019-557375 dated Jan. 28, 2021.
Yang et al. "Enhancement of Photoluminescence in Y3Al5O12:Eu 3+ Ceramics by Li Doping", Journal of the Korean Physical Society, vol. 52, No. 1, pp. 116-119, Jan. 1, 2008 (Jan. 1, 2008).
Liu et al. "Effect of Li+ ions co-doping on luminescence, scintillation properties and defects characteristics of LuAG: Ce ceramics," Optical Materials, vol. 64, pp. 245-249 (2017).
Lo et al. "Effect of LiCl on the crystallization behavior and luminescence of Y3Al5O12 : Tb," Materials Chemistry and Physics, vol. 57, No. 1, pp. 95-98, Nov. 1, 1998 (Nov. 1, 1998).
Notice of Publication corresponding to European Patent Application No. 19750719.7-1105 dated Dec. 18, 2019.
Blahuta et al., "Evidence and Consequences of Ce4+ in LYSO:Ce,Ca and LYSO:Ce,Mg Single Crystals for Medical Imaging Applications," IEEE Trans. Nucl. Sci., vol. 60, No. 4, pp. 3134-3141 (2013).
Bollinger, "Measurement of the Time Dependence of Scintillation Intensity by a Delayed Coincidence Method," Review of Scientific Instruments, vol. 32, p. 7, 1961.
Chen et al., "Transparent Y3Al5O12: Li, Ce Ceramics for Thermal Neutron Detection." J. Am. Ceram. Soc., vol. 96(4), pp. 1067-1069 (2013).
Cutler et al., "Scintillation Non-Proportionality of Lutetium- and Yttrium-Based Silicates and Aluminates," IEEE Trans. Nucl. Sci., vol. 56, No. 3, pp. 915-919 (2009).
Dickens et al., "Increased luminescence and improved decay kinetics in lithium and cerium co-doped yttrium aluminum garnet scintillators grown by the Czochralski method." Journal of Applied Physics, vol. 121, Article ID 123104 (2017).
Dorenbos et al., "Non-Proportionality in the Scintillation Response and the Energy Resolution Obtainable with Scintillation Crystals," IEEE Transactions on Nuclear Science, 42(6), 2190-2202 (1995).
Dorenbos, "Fundamental Limitations in the Performance of Ce3+ –,Pr3+–, and Eu2+–Activated Scintillators," IEEE Transactions on Nuclear Science, vol. 57, No. 3, pp. 1162-1167 (2010).
Drozdowski et al., "Effect of Lu-to-Y ratio and Mo coactivation on scintillation properties of LuYAG:Pr and LuAG:Pr,Mo crystals," Optical Materials, vol. 59, pp. 107-114, Sep. 1, 2016 (2016).
Foster et al. "Effects of Li+ codoping on (Lu0.75Y0.25)3Al5O12: Pr3+ single crystal scintillators," PowerPoint, presented at a poster competition on the UT Knoxville campus Oct. 2018, 1 page (2018).
Foster et al. "Improvements in Light Yield and Energy Resolution by Li+ Codoping (Lu0.75Y0.25)3Al5O12: Pr3+ Single Crystal Scintillators," Rapid Research Letter, Phys. Status Solidi RRL, 1800280, published online: Jul. 4, 2018, 4 pages (2018).
Foster et al., "Effects of Li+ codoping on (Lu0.75Y0.25)3Al5O12:Pr3+ single crystal scintillators," presented at the 2018 Symposium on Radiation Measurements and Applications, Jun. 11-14, 2018, Univ. Michigan, Ann Arbor, Michigan (SORMA XVII), 1 page (2018).
Guzik et al., "TUKAN—an 8K pulse height analyzer and multichannel scaler with a PCI or a USB interface," IEEE Transactions on Nuclear Science, vol. 53, No. 1, pp. 231-235, 2006.
Kamada et al., "2 inch diameter single crystal growth and scintillation properties of Ce:Gd3Al2Ga3O12," J. Cryst. Growth, vol. 352, pp. 88-90 (2012).
Kamada et al., "2 inch size Czochralski growth and scintillation properties of Li+ co-doped Ce:Gd3Ga3Al2O12." Optical Materials, vol. 65, pp. 52-55 (2017).
Kamada et al., "Growth and scintillation properties of Li and Ce co-doped Lu3Al5O12 scintillator." Journal of Crystal Growth, vol. 452, pp. 85-88 (2016).
Kapusta, et al., "A high-energy resolution observed from a YAP : Ce scintillator," Nuclear Instruments and Methods in Physics Research, Section A: Accelerators, Spectrometers, Detectors and Associated Equipment, vol. 421, No. 3, pp. 610-613, Feb. 1, 1999 (1999).
Khodyuk et al., "Nonproportional Response Between 0.1-100 keV Energy by Means of Highly Monochromatic Synchrotron X-Rays." IEEE Transactions on Nuclear Science, 57(3) 1175-1181 (2010).
Liu et al., "Effect of Mg2+ co-doping on the scintillation performance of LuAG:Ce ceramics," Phys. Status Solidi RRL—Rapid Res. Lett. 8, No. 1, pp. 105-109 (2014).
Melcher et al., "Cerium Oxidation State in LSO:Ce Scintillators," IEEE Trans. Nucl. Sci., vol. 52, No. 5, pp. 1809-1812 (2005).
Melcher et al., "Scintillator Design Via Codoping," JPS Conf. Proc., 11, 8, pp. 020001-1 to 020001-8 (2016).
Moszyński et al., "Absolute Light Output of Scintillators," IEEE Trans. Nucl. Sci., vol. 44, No. 3, pp. 1052-1061 (1997).
Nikl et al., "Photo- and radioluminescence of Pr-doped Lu3Al5O12 single crystal," physica status solidi (a), vol. 202, No. 1, pp. R4-R6 (2005).
Nikl, "The antisite LuAl defect-related trap in Lu3Al5o12:Ce single crystal," Phys. Status Solidi (b), vol. 242, No. 14, pp. R119-R121 (2005).
Office Action corresponding to Canadian Patent Application No. 3,059,126 dated Mar. 31, 2021.
Pejchal et al., "Luminescence and scintillation properties of Mg-codoped LuAG:Pr single crystals annealed in air," J. Lumin., vol. 181, pp. 277-285 (2017).

(56) References Cited

OTHER PUBLICATIONS

Petrosyan et al., "Growth of Ce-doped garnets with additional monovalent impurities and related effects." SCINT 2017—14th Int. Conference on Scintillating Materials and their Applications, Sep. 22, 2017, 1 page.

Sreebunpeng et al., "Scintillation response of $Lu_3Al_5O_{12}:Pr^{3+}$ single crystal scintillators," Nucl. Instrum. Methods Phys. Res. B, vol. 286, pp. 85-88 (2012).

Suzuki et al., "Fast and High-Energy-Resolution Oxide Scintillator: Ce-Doped $(La,Gd)_2Si_2O_7$." Applied Physics Express, 5(10), Article ID 102601 (2012).

van Eijk et al., "Energy resolution of some new inorganic-scintillator gamma-ray detectors," Radiation Measurements, vol. 33, No. 5, pp. 521-525, Oct. 1, 2001 (2001).

Wu et al., Role of $Ce^{4+}$ in the Scintillation Mechanism of Codoped $Gd_3Ga_3Al_2O_{12}$:Ce, Phys. Rev. Appl., 2, pp. 044009-1 to 044009-3 (2014).

Yoshikawa et al., "Crystal growth and scintillation properties of multi-component oxide single crystals: Ce:GGAG and Ce:La-GPS," Journal of Luminescence, vol. 169, pp. 387-393, Jan. 1, 2016 (2016).

Yoshikawa et al., "Czochralski Growth and Properties of Scintillating Crystals," Acta Physica Polonica A, vol. 124, No. 2, pp. 250-264 (2013).

Yoshino et al., "$Li^+$, $Na^+$ and $K^+$ co-doping effects on scintillation properties of Ce: $Gd_3Ga_3Al_2O_{12}$ single crystals." Journal of Crystal Growth, vol. 491, pp. 1-5 (2018).

Decision to Grant corresponding to Japanese Patent Application No. 2019-557375 dated Oct. 5, 2021.

Office Action corresponding to European Patent Application No. 19750719.7-1105 dated Aug. 24, 2021.

Office Action corresponding to Korean Patent Application No. 10-2019-7032397 dated Sep. 13, 2021.

GARNET SCINTILLATOR CO-DOPED WITH MONOVALENT ION

RELATED APPLICATIONS

This application is a 35 U.S.C. Section 371 national phase application of PCT International Application Serial No. PCT/US2019/016965, filed Feb. 7, 2019, which claims priority to and the benefit of U.S. Provisional Patent Application Ser. No. 62/627,399, filed Feb. 7, 2018 and U.S. Provisional Patent Application Ser. No. 62/672,890, filed May 17, 2018; the disclosure of each of which is incorporated herein by reference in its entirety.

TECHNICAL FIELD

The presently disclosed subject matter relates to garnet-type oxide scintillators codoped with monovalent cations, their optical (e.g., scintillation and phosphorescence) properties, and their use as scintillation materials in radiation detectors and/or in methods of detecting, for example, X-rays, gamma rays and/or neutrons. In particular, the presently disclosed subject matter relates to garnet-type oxide materials such as lutetium yttrium aluminum garnet (LuYAG)-type materials and other rare earth aluminum garnet materials, that are doped with a dopant ion, such as $Pr^{3+}$ or another activator, and codoped with at least one type of monovalent alkali metal cation, such as $Li^+$.

ABBREVIATIONS

%=percentage
° C.=degrees Celsius
μCi=microcurie
μs=microseconds
$\tau_d$=decay time
Al=aluminum
at=atomic
a.u.=arbitrary unit
CCD=charge-coupled device
Ce=cerium
Cs=cesium
CT=computed tomography
ER=energy resolution
Eu=europium
g=grams
Gd=gadolinium
K=potassium
keV=kiloelectronvolts
La=lanthanum
Li=lithium
LO=light output
Lu=lutetium
LuAG=lutetium aluminum garnet
LuYAG=lutetium yttrium aluminum garnet
LY=light yield
MeV=megaelectronvolt
mm=millimeter
mol=mole
MPa=megapascals
Na=sodium
nm=nanometer
ns=nanoseconds
ph=photons
PL=photoluminescence
ppm=parts per million
PMT=photomultiplier tube
Pr=praseodymium
Rb=rubidium
RL=radioluminescence
RT=room temperature
Sc=scandium
SPECT=single photon emission computed tomography
Tb=terbium
TL=thermoluminescence
wt=weight
Y=yttrium

BACKGROUND

In industrial applications for radiation detection, such as medical imaging and national security, desirable characteristics for scintillators include high light yield, good energy resolution, and fast scintillation decay time. Recently, with the development of cerium doped garnet scintillators such as lutetium aluminum garnet (LuAG) and gadolinium gallium aluminum garnet (GGAG) scintillators, researchers have reported light yields as high as 46,000 photons per megaelectronvolt (ph/MeV) and decay times reaching as fast as 30 nanoseconds (ns). However, LuAG scintillators often tend to not reach their full potential when it comes to scintillation due to intrinsic defects, such as charge carrier traps formed from the $Lu_{Al}$ anti-site defects and oxygen vacancies.

Accordingly, there is an ongoing need for additional garnet-type scintillator materials, such as those with higher light yield, improved energy resolution, and/or more rapid scintillation decay time. There is also an ongoing need for additional methods of altering the properties of garnet-type scintillator materials.

SUMMARY

In some embodiments, the presently disclosed subject matter provides a scintillator material. In some embodiments, the scintillator material comprises a composition of Formula (I):

$$[(RE_{1-x}RE'_x)_{1-y-z}A_yB_z]_3Al_5O_{12} \quad (I),$$

wherein: $0 \leq x \leq 1.0$, $0 < y \leq 0.05$, $0 < z \leq 0.1$, RE is a first rare earth element; RE' is a second rare earth element or a combination of a second rare earth element and at least one more or more additional rare earth elements, subject to the proviso that RE' does not comprise the first rare earth element RE; A is a dopant ion selected from the group comprising Pr, Nd, Sm, Eu, Gd, Tb, Yb, Bi, Sb, and any combination thereof, subject to the proviso that A does not comprise an ion of the same element as RE or RE'; and B is at least one type of monovalent cation, optionally a cation of an element selected from the group comprising Li, Na, K, Rb, Cs, and Fr. In some embodiments, RE is Lu. In some embodiments, RE' is Y. In some embodiments, $0.1 \leq x \leq 0.5$, optionally wherein x is 0.25. In some embodiments, A is $Pr^{3+}$. In some embodiments, $0.0001 \leq y \leq 0.015$, optionally wherein y is 0.004 or 0.012. In some embodiments, B is $Li^+$. In some embodiments, $0.0002 \leq z \leq 0.1$, optionally wherein $0.001 \leq z \leq 0.1$, further optionally wherein z is 0.002, 0.008, or 0.02.

In some embodiments, provided is a scintillator material comprising a composition of Formula (II):

$$[(Lu_{1-x}RE'_x)_{1-y-z}A_yB_z]_3Al_5O_{12} \quad (II),$$

wherein: $0.05 \leq x \leq 1.0$, $0 < y \leq 0.05$, $0 < z \leq 0.1$, RE' is selected from the group comprising Ce, Dy, Er, Eu, Gd, Ho, La, Nd, Pr, Pm, Sm, Sc, Tb, Tm, Yb, Y and any combination thereof;

A is a dopant ion, optionally an ion of an element selected from the group comprising Ce, Pr, Nd, Sm, Eu, Gd, Tb, Yb, Bi, Sb, and any combination thereof, subject to the proviso that A does not comprise an ion of the same element as RE'; and B is at least one type of monovalent cation, optionally a cation of an element selected from the group consisting of Li, Na, K, Rb, Cs, and Fr. In some embodiments, RE' is Y. In some embodiments, $0.1 \leq x \leq 0.5$, optionally wherein x is 0.25. In some embodiments, A is $Pr^{3+}$. In some embodiments, $0.0001 \leq y \leq 0.015$, optionally wherein y is 0.004 or 0.012. In some embodiments, B is $Li^+$. In some embodiments, $0.0002 \leq z \leq 0.1$, optionally wherein $0.001 \leq z \leq 0.1$, further optionally wherein z is 0.002, 0.008. or 0.02.

In some embodiments, provided is a scintillator material comprising a composition of Formula (III):

$$[(Lu_{1-x}Y_x)_{1-y-z}A_yB_z]_3Al_5O_{12} \quad (III),$$

wherein: $0.05 \leq x \leq 30.5$, $0 < y \leq 0.05$, $0 < z \leq 0.1$; A is a dopant ion, optionally an ion of an element selected from the group comprising Ce, Pr, Nd, Sm, Eu, Gd, Tb, Yb, Bi, Sb, and any combination thereof; and B is at least one type of monovalent cation, optionally a cation of an element selected from the group comprising Li, Na, K, Rb, Cs, and Fr. In some embodiments, x is 0.25. In some embodiments, A is $Pr^{3+}$. In some embodiments, $0.0001 \leq y \leq 0.015$, optionally wherein y is 0.004 or 0.012. In some embodiments, B is $Li^+$. In some embodiments, $0.0002 \leq z \leq 0.1$, optionally wherein $0.001 \leq z \leq 0.1$, further optionally wherein z is 0.002, 0.008, or 0.02.

In some embodiments, the scintillator material comprises a material selected from the group comprising $(Lu_{0.75}, Y_{0.25})_3Al_5O_{12}$:0.4% $Pr^{3+}$ codoped with 0.2% $Li^+$, $(Lu_{0.75}, Y_{0.25})_3Al_5O_{12}$:0.4% $Pr^{3+}$ codoped with 0.8% $Li^+$, $(Lu_{0.75}, Y_{0.25})_3Al_5O_{12}$:0.4% $Pr^{3+}$ codoped with 2.0% $Li^+$, $(Lu_{0.75}, Y_{0.25})_3Al_5O_{12}$:1.2% $Pr^{3+}$ codoped with 0.308 at % $Na^+$, $(Lu_{0.75}, Y_{0.25})_3Al_5O_{12}$:1.2% $Pr^{3+}$ codoped with 0.6 at % $Li^+$, $(Lu_{0.75}, Y_{0.25})_3Al_5O_{12}$:1.2% $Pr^{3+}$ codoped with 0.6 at % $K^+$, $(Lu_{0.75}, Y_{0.25})_3Al_5O_{12}$:1.2% $Pr^{3+}$ codoped with 2.4 at % $Li^+$, and $(Lu_{0.75}, Y_{0.25})_3Al_5O_{12}$:1.2% $Pr^{3+}$ codoped with 6 at % $Li^+$, optionally wherein the material is selected from the group comprising $(Lu_{0.75}, Y_{0.25})_3Al_5O_{12}$:0.4% $Pr^{3+}$ codoped with 0.2% $Li^+$, $(Lu_{0.75}, Y_{0.25})_3Al_5O_{12}$:0.4% $Pr^{3+}$ codoped with 0.8% $Li^+$, and $(Lu_{0.75}, Y_{0.25})_3Al_5O_{12}$:0.4% $Pr^{3+}$ codoped with 2.0% $Li^+$.

In some embodiments, the scintillator material exhibits one or more of increased light yield, improved energy resolution, and an accelerated fast decay component as compared to the scintillator material where B is absent. In some embodiments, the scintillator material is a single crystal material. In some embodiments, the scintillator material is a polycrystalline and/or a ceramic material.

In some embodiments, provided is a radiation detector comprising a photon detector and a scintillation material in accordance with the presently disclosed subject matter. In some embodiments, the detector is a medical diagnostic device, a device for oil exploration, or a device for container or baggage scanning.

In some embodiments, provided is a method of detecting gamma rays, X-rays, cosmic rays and/or particles having an energy of 1 keV or greater, the method comprising using the radiation detector comprising a photon detector and a scintillation material in accordance with the presently disclosed subject matter.

In some embodiments, provided is a method of preparing a scintillator material in accordance with the presently disclosed subject matter, wherein the method comprises pulling a single crystal from molten raw materials.

In some embodiments, the presently disclosed subject matter provides a method of altering one or more scintillation and/or optical properties of a rare earth aluminum garnet scintillator comprising a matrix having the formula $RE''_3Al_5O_{12}$, wherein RE'' is a mixture of at least two rare earth elements and wherein the scintillator further comprises at least one dopant selected from the group consisting of Ce, Pr, Nd, Sm, Eu, Gd, Tb, Yb, Bi, Sb, and any combination thereof, subject to the proviso that the dopant does not comprise an ion of the same element as any rare earth element of the rare earth aluminum garnet matrix, wherein the method comprises preparing the rare earth aluminum garnet scintillator in the presence of a monovalent codopant ion, thereby providing a codoped rare earth aluminum garnet scintillator material, optionally wherein the monovalent codopant ion is an alkali metal ion. In some embodiments, the presently disclosed subject matter provides a method of altering one or more scintillation and/or optical properties of a rare earth aluminum garnet scintillator comprising a matrix having the formula $RE''_3Al_5O_{12}$, wherein RE'' is a mixture of at least two rare earth elements and wherein the scintillator further comprises at least one dopant selected from the group comprising Pr, Nd, Sm, Eu, Gd, Tb, Yb, Bi, Sb, and any combination thereof, subject to the proviso that the dopant does not comprise an ion of the same element as any rare earth element of the rare earth aluminum garnet matrix, optionally wherein the rare earth aluminum garnet scintillator is a praseodymium (Pr) doped lutetium yttrium aluminum garnet (LuYAG) scintillator, wherein the method comprises preparing the rare earth aluminum garnet scintillator in the presence of a monovalent codopant ion, thereby providing a codoped rare earth aluminum garnet scintillator material, optionally wherein the monovalent codopant ion is an alkali metal ion, further optionally wherein the monovalent codopant ion is $Li^+$. In some embodiments, the codoped rare earth aluminum garnet scintillator material exhibits increased light yield, improved energy resolution, better proportionality, and/or faster decay time compared to the same rare earth aluminum garnet scintillator material without the codopant ion.

In some embodiments, provided is a scintillator material comprising a composition of Formula (I'):

$$[(RE_{1-x}RE'_x)_{1-y-z}A_yB'_z]_3Al_5O_{12} \quad (I'),$$

wherein: $0 \leq x \leq 1.0$; $0 < y \leq 0.05$, $0 < z \leq 0.1$, RE is a first rare earth element; RE' is a second rare earth element or a combination of a second rare earth element and at least one more or more additional rare earth elements, subject to the proviso that RE' does not comprise the first rare earth element RE; A is a dopant ion selected from the group comprising Pr, Nd, Sm, Eu, Gd, Tb, Yb, Bi, Sb, and any combination thereof, subject to the proviso that A does not comprise an ion of the same element as RE or RE'; and B' is a monovalent cation of a lithium isotope or a mixture thereof, optionally wherein B' is a monovalent cation of a lithium-6 isotope (i.e., $^6Li^+$). In some embodiments, $0.0001 \leq z \leq 0.1$, optionally $0.001 \leq z \leq 0.1$. In some embodiments, RE is Lu. In some embodiments, RE' is Y, optionally wherein x is about 0.25. In some embodiments, A is $Pr^{3+}$, optionally wherein $0.0001 \leq y \leq 0.015$, further optionally wherein y is 0.004 or 0.012.

In some embodiments, provided is a radiation detector comprising a photon detector and a scintillator material in accordance with the presently disclosed subject matter.

In some embodiments, provided is a method of detecting neutrons, wherein the method comprises using a radiation detector comprising a photon detector and a scintillation material in accordance with the presently disclosed subject matter.

Accordingly, it is an object of the presently disclosed subject matter to provide codoped rare earth aluminum garnet scintillators, radiation detectors comprising the codoped scintillators; methods of detecting gamma rays, X-rays, cosmic rays and/or particles having an energy of 1 keV or greater with the radiation detectors; methods of preparing the optical materials, and methods of altering the scintillation and/or optical properties of the scintillators.

An object of the presently disclosed subject matter having been stated hereinabove, and which is achieved in whole or in part by the presently disclosed subject matter, other objects will become evident as the description proceeds hereinbelow.

DETAILED DESCRIPTION

Figure 1:
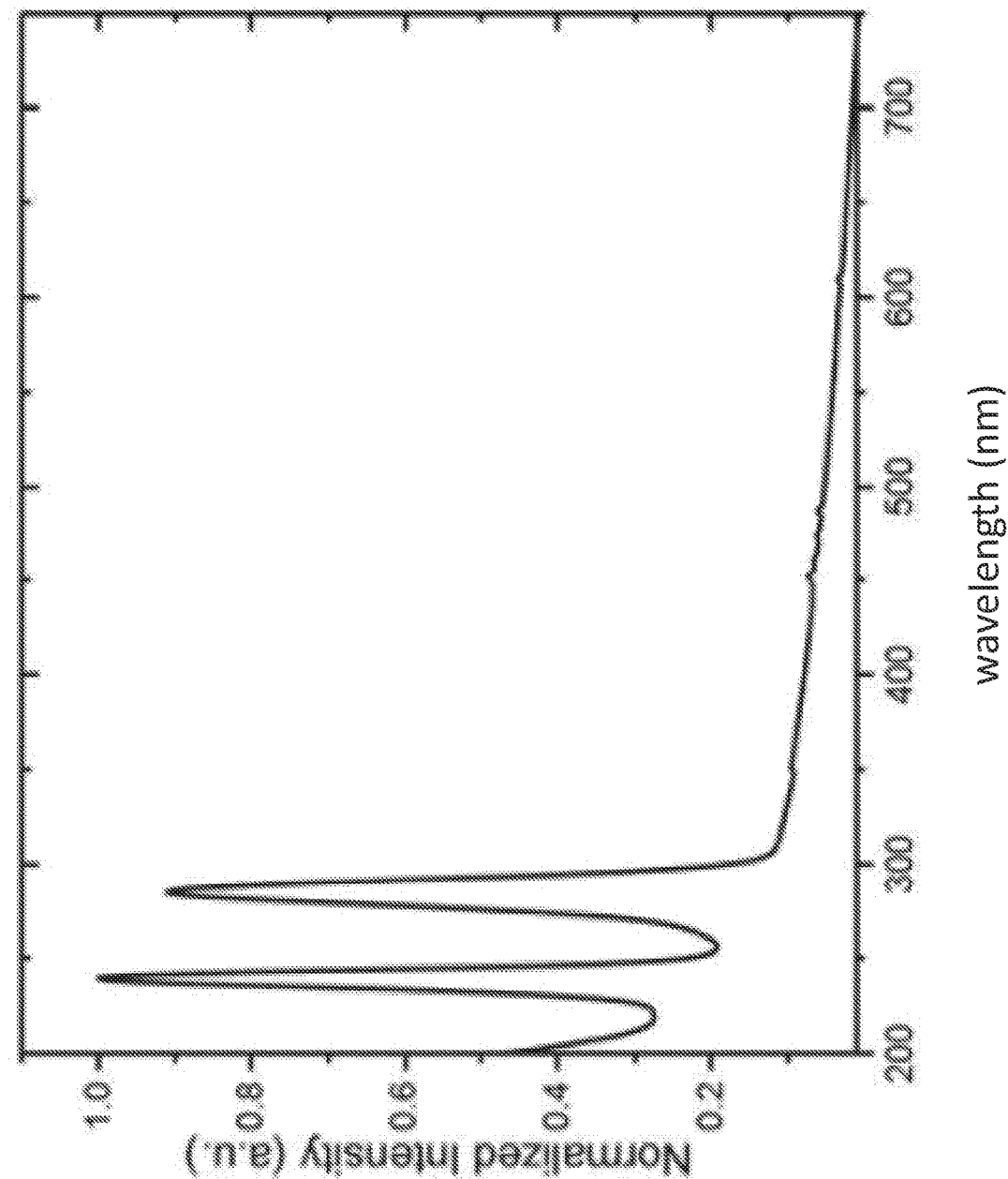
FIG. 1 is a graph of the absorbance spectra (normalized intensity (in arbitrary units (a.u.)) versus wavelength (in nanometers (nm))) of a lutetium aluminum oxide single crystal where about 25 percent of the lutetium is replaced by yttrium and where the material is doped with 0.4 atomic percent (at %) praseodymium and codoped with 0.2 at % lithium (i.e., $Lu_{0.744}Y_{0.25}Pr_{0.004}Li_{0.002})Al_5O_{12}$).

The presently disclosed subject matter describes a method of tailoring the properties of garnet-type oxide scintillators to meet the particular needs of different applications. More particularly, in some embodiments, garnet-type oxide scintillators, such as lutetium yttrium aluminum garnet (LuYAG), with modified scintillation decay time, energy resolution, and/or light yield were prepared by codoping of at least one type of monovalent cation at a ratio of about 30,000 weight (wt) parts per million (ppm) or less with respect to all cations. These scintillators, when doped with activators such as praseodymium (Pr), are suitable for radiation detection applications such as medical imaging, homeland security, high energy physics experiments, and geophysical exploration. Codoping of these scintillators with monovalent ions can be used to modify both optical and scintillation properties.

The presently disclosed subject matter will now be described more fully. The presently disclosed subject matter can, however, be embodied in different forms and should not be construed as limited to the embodiments set forth herein below and in the accompanying Examples. Rather, these embodiments are provided so that this disclosure will be thorough and complete, and will fully convey the scope of the embodiments to those skilled in the art.

All references listed herein, including but not limited to all patents, patent applications and publications thereof, and scientific journal articles, are incorporated herein by reference in their entireties to the extent that they supplement, explain, provide a background for, or teach methodology, techniques, and/or compositions employed herein.

I. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long-standing patent law convention, the terms "a", "an", and "the" refer to "one or more" when used in this application, including the claims.

The term "and/or" when used in describing two or more items or conditions, refers to situations where all named items or conditions are present or applicable, or to situations wherein only one (or less than all) of the items or conditions is present or applicable.

The use of the term "or" in the claims is used to mean "and/or" unless explicitly indicated to refer to alternatives only or the alternatives are mutually exclusive, although the disclosure supports a definition that refers to only alternatives and "and/or." As used herein "another" can mean at least a second or more.

The term "comprising", which is synonymous with "including," "containing," or "characterized by" is inclusive or open-ended and does not exclude additional, unrecited elements or method steps. "Comprising" is a term of art used in claim language which means that the named elements are essential, but other elements can be added and still form a construct within the scope of the claim.

As used herein, the phrase "consisting of" excludes any element, step, or ingredient not specified in the claim. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed and claimed subject matter can include the use of either of the other two terms.

Unless otherwise indicated, all numbers expressing quantities of time, temperature, light output, atomic (at) or mole (mol) percentage (%), and so forth used in the specification and claims are to be understood as being modified in all instances by the term "about". Accordingly, unless indicated to the contrary, the numerical parameters set forth in this specification and attached claims are approximations that can vary depending upon the desired properties sought to be obtained by the presently disclosed subject matter.

As used herein, the term "about", when referring to a value is meant to encompass variations of in one example ±20% or ±10%, in another example ±5%, in another example ±1%, and in still another example ±0.1% from the specified amount, as such variations are appropriate to perform the disclosed methods.

The term "scintillator" refers to a material that emits light (e.g., visible light) in response to stimulation by high energy radiation (e.g., X, $\alpha$, $\beta$, or $\gamma$ radiation).

The term "phosphor" as used herein refers to a material that emits light (e.g., visible light) in response to irradiation with electromagnetic or particle radiation.

In some embodiments, the compositional formula expression of an optical material (e.g., a scintillation material or a phosphor) can contain a colon ":", wherein the composition of the main or base matrix material (e.g., the main rare earth aluminum garnet matrix) is indicated on the left side of the colon, and the activator (or dopant ion) or the activator and the codopant ion are indicated on the right side of the colon. In some embodiments, the dopant and codopant can replace part of the rare earth metal element(s) in a rare earth metal aluminum oxide garnet-type scintillator material. For example, $Lu_3Al_5O_{12}$:0.4Pr, 0.2Li, LuAG:0.4% Pr, 0.2% Li, and $Lu_3Al_5O_{12}$:$Pr^{3+}$ 0.4%, $Li^+$ 0.2% each represent a LuAG optical material activated by praseodymium and codoped with lithium, wherein 0.4 atomic % of the lutetium is replaced by praseodymium and 0.2 atomic % of the lutetium is replaced by lithium. Thus, in some embodiments, the atomic % of a dopant can be expressed as the atomic % relative to the total amount of dopant and rare earth metal(s) (or dopant, rare earth metal(s) and codopant) in the base material. The atomic % of the codopant ion can be expressed as the atomic or mole % relative to the total amount of rare earth metal(s), dopant and codopant.

The term "high energy radiation" can refer to electromagnetic radiation having energy higher than that of ultraviolet radiation, including, but not limited to X radiation (i.e., X-ray radiation), alpha ($\alpha$) particles, gamma ($\gamma$) radiation, and beta ($\beta$) radiation. In some embodiments, the high energy radiation refers to gamma rays, cosmic rays, X-rays, and/or particles having an energy of 1 keV or greater. Scintillator materials as described herein can be used as components of radiation detectors in apparatuses such as counters, image intensifiers, and computed tomography (CT) scanners.

"Optical coupling" as used herein refers to a physical coupling between a scintillator and a photosensor, e.g., via the presence of optical grease or another optical coupling compound (or index matching compound) that bridges the gap between the scintillator and the photosensor. In addition to optical grease, optical coupling compounds can include, for example, liquids, oils and gels.

"Light output" can refer to the number of light photons produced per unit energy deposited, e.g., by a gamma ray being absorbed, typically the number of light photons/MeV.

As used herein, chemical ions can be represented simply by their chemical element symbols alone (e.g., Pr for praseodymium ion(s) (e.g., $Pr^{3+}$) or Li for lithium ion(s) (e.g., $Li^+$)). Similarly, the terms "alkali metal" and "rare earth element" are used herein to refer to an alkali metal ion or a combination of alkali metal ions and a rare earth element ion or a combination of rare earth element ions, respectively.

The term "rare earth element" as used herein refers to one or more elements selected from a lanthanide (e.g., lanthanum (La), cerium (Ce), Praseodymium (Pr), neodymium (Nd), promethium (Pm), samarium (Sm), europium (Eu), gadolinium (Gd), terbium (Tb), dysprosium (Dy), holmium (Ho) erbium (Er), thulium (Tm), ytterbium (Yb) and lutetium (Lu)), scandium (Sc), and yttrium (Y).

The terms "rare earth aluminum garnet" as used herein refer to compound having mainly a chemical formula $A_3B_5O_{12}$, wherein cations of A and B have two different types of sites, each site being surrounded by oxygen ions. A is a rare earth element cation or a mixture of rare earth element cations and B is aluminum cations. The material can also include a small amount (e.g., about 10 atomic % or less or about 5 atomic % or less relative to A) of each of one or more dopant ions (e.g., a dopant ion and a codopant ion). In some embodiments, A includes as least some Lu. In some embodiments, A is a mixture of Lu and Y.

II. Garnet-Type Scintillators Codoped with Monovalent Cations

As described hereinabove, it is believed that some garnet-type scintillators, such as lutetium aluminum garnet (LuAG) scintillators, have not yet reached their full potential when it comes to scintillation due to intrinsic defects. According to one aspect of the presently disclosed subject matter, a method of tailoring the properties of garnet-type scintillators is provided wherein the scintillators are codoped with monovalent ions. Thus, in some embodiments, the presently disclosed subject matter provides a monovalent cation codoped rare earth aluminum garnet scintillator material. In some embodiments, the rare earth element of the rare earth aluminum garnet is Lu, Y, or a mixture thereof. In some embodiments, the rare earth component of the rare earth aluminum garnet is a mixture of Lu and Y. The rare earth aluminum garnet can be doped with any suitable dopant/activator ion. In some embodiments, the activator/dopant ion is an ion of an element selected from the group comprising Ce, Pr, Nd, Sm, Eu, Gd, Tb, Yb, Bi, Sb, or a combination thereof. In some embodiments, the activator/dopant ion is $Ce^{3+}$ or $Pr^{3+}$. In some embodiments, the activator/dopant ion is an ion of an element other than Ce. In some embodiments, the activator/dopant ion is $Pr^{3+}$.

Generally, the activator/dopant ion and the codopant ion are each present in the material in relatively small amounts, e.g., about 10, 5.0, 1.0, 0.9, 0.8, 0.7, 0.6, 0.5, 0.4, 0.3, 0.2, 0.1 or less atomic percentage compared to the amount of the rare earth element or elements present in the main garnet matrix. Unless otherwise indicated, when an atomic percentage of dopant or codopant ion is described, the atomic percentage is based on the amount of dopant or codopant ion present in the starting materials used to prepare the scintillator material (e.g., in the initial melt). This amount can vary in the prepared scintillator, e.g., due to segregation during melt growth. In some embodiments, the amount of dopant is about 5.0 atomic % or less compared to rare earth element in the main garnet matrix. In some embodiments, the amount of dopant is between about 1.5 atomic % and about 0.05 atomic % compared to rare earth element in the main garnet matrix. In some embodiments, the amount of dopant is about 0.4 atomic % compared to the rare earth element in the main garnet matrix. In some embodiments, the amount of dopant is about 1.2 atomic % compared to the rare earth element in the main garnet matrix.

In some embodiments, the presently disclosed subject matter provides a scintillator material comprising, consisting essentially or, or consisting of a composition of Formula (I):

wherein:
$0 \leq x \leq 1.0$;
$0 < y \leq 0.05$;
$0 < z \leq 0.1$;

RE is a first rare earth element (e.g., La, Ce, Pr, Nd, Pm, Sm, Eu, Gd, Tb, Dy, Ho, Er, Tm, Yb, Lu, Sc, or Y);

RE' is a second rare earth element or a combination of a second rare earth element and at least one more or more additional rare earth elements, subject to the proviso that RE' does not comprise the first rare earth element RE;

A is a dopant ion, subject to the proviso that A does not comprise an ion of the same element as RE or RE'; and B is at least one type of monovalent cation.

In some embodiments RE' is a rare earth element other than Ce. Suitable dopant ions for A include, but are not limited to, the group comprising Pr, Nd, Sm, Eu, Gd, Tb, Yb, Bi, Sb, and any combination thereof. In some embodiments, A is a Pr ion (e.g., $Pr^{3+}$).

Suitable codopant ions for B include, but are not limited to, cations of alkali metal elements, such as, but not limited to, Li, Na, K, Rb, Cs and Fr. In some embodiments, B is Li, Na, or K. In some embodiments, B is Li. In some embodiment B is a cation of a lithium-6 isotope ($^6Li$) or a mixture of lithium isotope cations enriched for $^6Li^+$.

The value x can describe the composition of second rare-earth element RE' in the main garnet matrix (i.e., in the scintillator material excluding dopant and/or codopant ions). In some embodiments, x is between 0.05 and about 0.5. In some embodiments, x is between 0.1 and about 0.5 (e.g., about 0.1, 0.15, 0.2, 0.25, 0.3, 0.35, 0.4, 0.45, or about 0.5). In some embodiments, x is between 0.15 and about 0.35. In some embodiments, x is between about 0.20 and about 0.30. In some embodiments, x is about 0.25.

The value y describes the composition of activator/dopant ion. If the amount of activator is too small, energy absorbed by the material is not converted as efficiently to light. If the amount of activator is too large, the distance between activator ions can become too small, resulting in quenching. In some embodiments, the activator/dopant ion is provided at between about 0.0001 and about 5 atomic % (e.g., relative to the content of the rare earth elements (e.g., Lu and Y) in the main garnet matrix). Thus, in some embodiments, y is between about 0.0001 and about 0.05. As noted above, the common practice will be used herein of stating the amount of dopant relative to the rare earth element in the starting material mixture used to prepare the scintillator (e.g., the amount present in the melt from which the material is grown). The actual content of the dopant in the as prepared material can differ from this value (e.g., due to solid-liquid segregation, etc.). In some embodiments, $0.001 \leq y \leq 0.05$. In some embodiments, $0.001 \leq y \leq 0.015$. In some embodiments, the activator/dopant ion is provided at about 0.2 atomic %. Thus, in some embodiments, y is about 0.002. In some embodiments, the activator/dopant ion is provided at about 0.4 atomic %. Thus, in some embodiments, y is about 0.004. In some embodiments, the activator/dopant ion is provided at about 1.2 atomic %. Thus, in some embodiments, y is about 0.012.

The value z can determine the composition of codopant. In some embodiments, the codopant ion is believed to change the defect structure of the scintillator material, which can result in changes in the scintillation properties and/or performance of the material as compared to a similar non-codoped material. In some embodiments, the codopant is provided at between about 0.02 and about 10 atomic % (e.g., relative to the content of the rare earth elements in the main garnet matrix). Thus, z can be between about 0.0002 and about 0.1. In some embodiments, $0.001 \leq z \leq 0.1$. In some embodiments, $0.001 \leq z \leq 0.06$. In some embodiments, z is 0.002, 0.006, 0.008, 0.020, 0.024, or 0.06. In some embodiments, z is 0.002. In some embodiments, z is 0.008. In some embodiments, z is 0.02. Alternatively, in some embodiments, a greater amount of codopant can be used (e.g., up to about 20 atomic % or up to about 15 atomic %). For instance, in some embodiments, it is believed that the presently disclosed scintillators can find use in thermal neutron detection due to the n-alpha reaction on the $^6$Li isotope. As noted above for the dopant ion, the amount of codopant is expressed herein based upon the amount of codopant present in the starting material mixture used to prepare the scintillator.

In some embodiments, the scintillator material comprises, consists essentially of, or consists of a composition of Formula (II):

$$[(Lu_{1-x}RE'_x)_{1-y-z}A_yB_z]_3Al_5O_{12} \qquad (II),$$

wherein:
  $0.05 \leq x \leq 1.0$;
  $0 < y \leq 0.05$;
  $0 < z \leq 0.1$;
  RE' is selected from the group consisting of Ce, Dy, Er, Eu, Gd, Ho, La, Nd, Pr, Pm, Sm, Sc, Tb, Tm, Yb, Y and any combination thereof;
  A is a dopant ion (e.g., such as, but not limited to, the group comprising Ce, Pr, Nd, Sm, Eu, Gd, Tb, Yb, Bi, Sb, and any combination thereof) subject to the proviso that A does not comprise an ion of the same element as RE'; and
  B is at least one type of monovalent cation.

In some embodiments, RE' is free of Ce. In some embodiments, RE' is Y. In some embodiments, $0.05 \leq x \leq 0.5$. In some embodiments, $0.1 \leq x \leq 0.5$. In some embodiments, x is between 0.15 and about 0.35. In some embodiments, x is between about 0.20 and about 0.30. In some embodiments, x is about 0.25.

In some embodiments, A is a dopant ion of an element other than Ce. In some embodiments, A is $Pr^{3+}$. In some embodiments, $0.0001 \leq y \leq 0.05$. In some embodiments, $0.001 \leq y \leq 0.05$. In some embodiments, $0.001 \leq y \leq 0.015$. In some embodiments, y is 0.002. In some embodiments, y is 0.004. In some embodiments, y is 0.012.

In some embodiments, B is $Li^+$, $Na^+$, or $K^+$. In some embodiments, B is $Li^+$. In some embodiments, $0.0002 \leq z \leq 0.1$. In some embodiments, $0.001 \leq z \leq 0.1$. In some embodiments, $0.001 \leq z \leq 0.06$. In some embodiments, z is 0.002. In some embodiments, z is 0.006. In some embodiments, z is 0.008. In some embodiments, z is 0.02. In some embodiments, z is 0.024. In some embodiments, z is 0.06.

In some embodiments, the scintillator material comprises, consists essentially of, or consists of a composition of Formula (III):

$$[Lu_{1-x}Y_x)_{1-y-z}A_yB_z]_3Al_5O_{12} \qquad (III),$$

wherein:
  $0.05 \leq x \leq 0.5$;
  $0 < y \leq 0.05$;
  $0 < z \leq 0.1$;
  A is a dopant ion (e.g., such as, but not limited to, the group comprising Ce, Pr, Nd, Sm, Eu, Gd, Tb, Yb, Bi, Sb, and any combination thereof); and
  B is at least one type of monovalent cation.

In some embodiments, $0.1 \leq x \leq 0.5$. In some embodiments, x is between 0.15 and about 0.35. In some embodiments, x is between about 0.20 and about 0.30. In some embodiments, x is about 0.25.

In some embodiments, A is a dopant ion of an element other than Ce. In some embodiments, A is $Pr^{3+}$. In some embodiments, $0.0001 \leq y \leq 0.05$. In some embodiments, $0.001 \leq y \leq 0.05$. In some embodiments, $0.001 \leq y \leq 0.015$. In some embodiments, y is about 0.004. In some embodiments, y is about 0.012.

In some embodiments, B is $Li^+$, $Na^+$, or $K^+$. In some embodiments, B is $Li^+$. In some embodiments, $0.0002 \leq z \leq 0.1$. In some embodiments, $0.001 \leq z \leq 0.1$. In some embodiments, $0.001 \leq z \leq 0.06$. In some embodiments, z is 0.002. In some embodiments, z is 0.006. In some embodiments, z is 0.008. In some embodiments, z is 0.02. In some embodiments, z is 0.024. In some embodiments, z is 0.06.

In some embodiments, the scintillator material comprises, consists essentially of, or consists of a composition of Formula (I'):

$$[(RE_{1-x}RE'_x)_{1-y-z}A_yB'_z]_3Al_5O_{12} \qquad (I'),$$

wherein:
  $0 \leq x \leq 0.5$;
  $0 < y \leq 0.05$;
  $0 < z \leq 0.1$;
  RE is a first rare earth element;
  RE' is a second rare earth element or a combination of a second rare earth element and at least one more or more additional rare earth elements, subject to the proviso that RE' does not comprise the first rare earth element RE;
  A is a dopant ion selected from the group consisting of Pr, Nd, Sm, Eu, Gd, Tb, Yb, Bi, Sb, and any combination thereof, subject to the proviso that A does not comprise an ion of the same element as RE or RE'; and
  B' is a monovalent cation of a lithium isotope or a mixture thereof, optionally wherein B' is a monovalent cation of $^6$Li (i.e., $^6Li^+$) or is a mixture of lithium isotope cations enriched for $^6Li^+$.

In some embodiments, RE is Lu. In some embodiments, RE' is other than Ce. In some embodiments, RE' is Y. In some embodiments, $0.1 \leq x \leq 0.5$. In some embodiments $0.15 \leq x \leq 0.35$. In some embodiments, $0.20 \leq x \leq 0.3$. In some embodiments x is about 0.25. In some embodiments, A is an ion of Pr (e.g., $Pr^{3+}$).

In some embodiments, A is a dopant ion of an element other than Ce. In some embodiments, A is $Pr^{3+}$. In some embodiments, $0.0001 \leq y \leq 0.05$. In some embodiments, $0.001 \leq y \leq 0.05$. In some embodiments, $0.001 \leq y \leq 0.015$. In some embodiments, y is about 0.002. In some embodiments, y is about 0.004. In some embodiments, y is about 0.012.

In some embodiments, $0.0002 \leq z \leq 0.1$. In some embodiments, $0.001 \leq z \leq 0.1$. In some embodiments, $0.001 \leq z \leq 0.06$. In some embodiments, z is 0.002. In some embodiments, z is 0.006. In some embodiments, z is 0.008. In some embodiments, z is 0.02. In some embodiments, z is 0.024. In some embodiments, z is 0.06.

In some embodiments, the scintillator materials comprise, consist essentially of, or consist of $(Lu_{0.75}, Y_{0.25})_3Al_5O_{12}$: 0.4% $Pr^{3+}$ codoped with 0.2% $Li^+$, 0.8% $Li^+$, or 2.0% $Li^+$; $(Lu_{0.75}, Y_{0.25})_3Al_5O_{12}$:0.4% $Pr^{3+}$ codoped with 0.6 at % $Li^+$, 2.4 at % $Li^+$ or 6 at % $Li^+$ or $(Lu_{0.75}, Y_{0.25})_3Al_5O_{12}$:1.2% $Pr^{3+}$ codoped with 0.6 at % $K^+$ or 0.308 at % $Na^+$. In some embodiments, the scintillator materials comprise, consist essentially of, or consist of $(Lu_{0.75}, Y_{0.25})_3Al_5O_{12}$:0.4% $Pr^{3+}$ codoped with 0.2% $Li^+$, 0.8% $Li^+$, or 2.0% $Li^+$.

In some embodiments, the scintillator material exhibits one or more of increased light yield, better energy resolution, and an accelerated fast decay component as compared to the scintillator material where B is absent.

The scintillator materials of the presently disclosed subject matter (e.g., of Formulas (I), (I'), (II), or (III)) can be a single crystal, a polycrystalline material, and/or a ceramic. By "single crystal" is meant a material manufactured by a liquid phase method having few or no grain boundaries and wherein each adjoining crystal grain generally has the same orientation. In some embodiments, the material can be polycrystalline and/or ceramic and contain crystals of varying size and/or orientation.

III. Radiation Detectors, Related Devices and Methods

In some embodiments, the presently disclosed subject matter provides a radiation detector comprising an optical material (e.g., a scintillation material) comprising, consisting essentially of, or consisting of a composition of Formula (I), (I'), (II), or (III) as described hereinabove or a mixture of such materials. The radiation detector can comprise a scintillator (which absorbs radiation and emits light) and a photodetector (which detects said emitted light). The photodetector can be any suitable detector or detectors and can be or not be optically coupled to the scintillator material for producing an electrical signal in response to emission of light from the scintillator material. Thus, the photodetector can be configured to convert photons to an electrical signal. For example, a signal amplifier can be provided to convert an output signal from a photodiode into a voltage signal. The signal amplifier can also be designed to amplify the voltage signal. Electronics associated with the photodetector can be used to shape and digitize the electronic signal.

Figure 9:
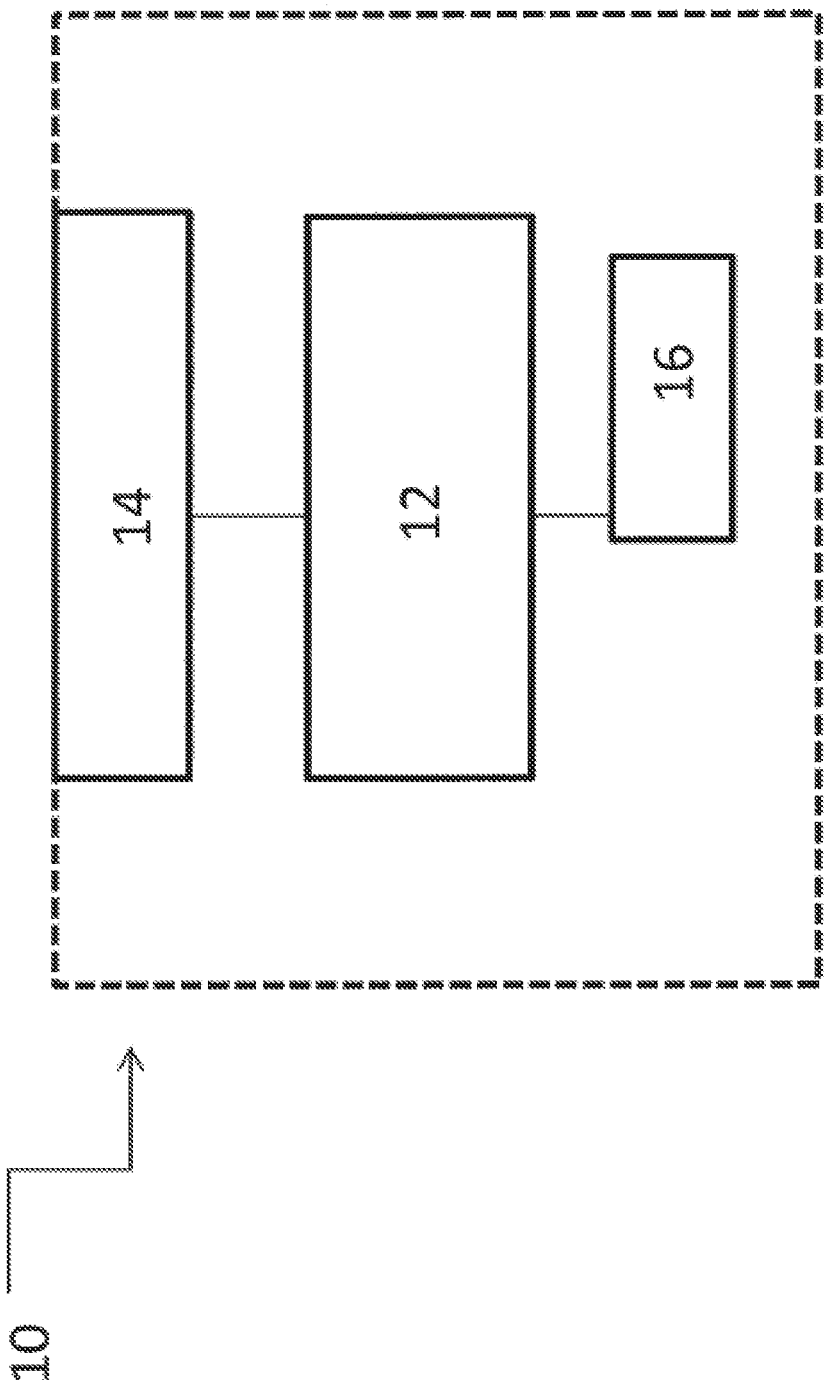
FIG. 9 is a schematic drawing of an apparatus for detecting radiation according to an aspect of the presently disclosed subject matter. Apparatus 10 includes photon detector 12 optically coupled to scintillator material 14. Apparatus 10 can optionally include electronics 16 for recording and/or displaying electronic signal from photon detector 12. Thus, optional electronics 16 can be in electronic communication with photon detector 12.

Referring now to FIG. 9, in some embodiments, the presently disclosed subject matter provides an apparatus 10 for detecting radiation wherein the apparatus comprises a photon detector 12 and a scintillator material 14 (e.g., a codoped LuYAG material). Scintillator material 14 can convert radiation to light that can be collected by a charge-coupled device (CCD) or a photomultiplier tube (PMT) or other photon detector 12 efficiently and at a fast rate.

Referring again to FIG. 9, photon detector 12 can be any suitable detector or detectors and can be optically coupled (e.g., via optical grease or another optical coupling compound, such as an optical coupling oil or liquid) to the scintillator (e.g., a codoped LuYAG material) for producing an electrical signal in response to emission of light from the scintillator. Thus, photon detector 12 can be configured to convert photons to an electrical signal. Electronics associated with photon detector 12 can be used to shape and digitize the electronic signal. Suitable photon detectors 12 include, but are not limited to, photomultiplier tubes, photodiodes, CCD sensors, and image intensifiers. Apparatus 10 can also include electronics 16 for recording and/or displaying the electronic signal.

In some embodiments, the radiation detector is configured for use as part of a medical or veterinary diagnostic device, a device for oil or other geological exploration (e.g., oil well logging probes), or as a device for security and/or military-related purposes (e.g., as a device for container, vehicle, or baggage scanning or for scanning humans or other animals). In some embodiments, the medical or veterinary diagnostic device is selected from, but not limited to, a positron emission tomography (PET) device, an X-ray computed tomography (CT) device, a single photon emission computed tomography (SPECT) device, or a planar nuclear medical imaging device. For example, the radiation detector can be configured to move (e.g., via mechanical and/or electronic controls) over and/or around a sample, such as a human or animal subject, such that it can detect radiation emitted from any desired site or sites on the sample. In some embodiments, the detector can be set or mounted on a rotating body to rotate the detector around a sample.

In some embodiments, the device can also include a radiation source. For instance, an X-ray CT device of the presently disclosed subject matter can include an X-ray source for radiating X-rays and a detector for detecting said X-rays. In some embodiments, the device can comprise a plurality of radiation detectors. The plurality of radiation detectors can be arranged, for example, in a cylindrical or other desired shape, for detecting radiation emitted from various positions on the surface of a sample.

In some embodiments, the presently disclosed subject matter provides a method for detecting radiation (or the absence of radiation) using a radiation detector comprising a scintillator as described hereinabove (e.g., a codoped LuYAG scintillator material). Thus, in some embodiments, the presently disclosed subject matter provides a method of detecting gamma rays, X-rays, cosmic rays and particles having an energy of 1 keV or greater, wherein the method comprises using a radiation detector comprising a material comprising a composition of one of Formulas (I), (II), or (III).

In some embodiments, the codopant comprises a lithium-6 isotope cation and the material is a composition of formula (I'). In some embodiments, the presently disclosed subject matter provides a method for thermal neutron detection using a radiation detector comprising a scintillation material of formula (I').

In some embodiments, the method can comprise providing a radiation detector comprising a photodetector and an optical (e.g., scintillator) material of the presently disclosed subject matter; positioning the detector, wherein the positioning comprises placing the detector in a location wherein the optical material is in the path of a beam of radiation (or the suspected path of a beam of radiation); and detecting light (or detecting the absence of light) emitted by the optical material with the photodetector. Detecting the light emitted by the optical material can comprise converting photons to an electrical signal. Detecting can also comprise processing the electrical signal to shape, digitize, or amplify the signal. The method can further comprise displaying the electrical signal or processed electrical signal.

In some embodiments, the presently disclosed subject matter provides a device comprising a photodetector and a scintillator material as described hereinabove, such as a material comprising a monovalent cation codoped rare earth aluminum garnet material, such as a material comprising a composition of one of Formulas (I), (I') (II), or (III), or a mixture of such materials. In some embodiments, the device comprising the photodetector and the scintillator material is adapted for use in medical imaging, geological exploration, or homeland security. In some embodiments, the presently disclosed subject matter provides a method of detecting high energy photons and particles, wherein the method comprises using the device comprising the photodetector and the optical material comprising a composition of one of Formulas (I), (I'), (II), or (III), or a mixture of such materials.

IV. Methods of Preparation

The presently disclosed optical (e.g., scintillation) materials can be prepared via any suitable method as would be apparent to one of ordinary skill in the art upon a review of the instant disclosure. In some embodiments, the presently disclosed subject matter provides a method of preparing a codoped garnet-type scintillator material. In some embodiments, the presently disclosed subject matter provides a method for preparing a scintillator material that comprises preparing a crystal from a melt. For instance, in some embodiments, the codoped garnet-type scintillator material can be a crystal grown by the Czochralski (pulling-up) method. However, single crystals or polycrystalline materials and/or ceramics grown or produced by other methods can also be used as a scintillator material according to the present disclosure. For example, alternative methods for producing garnet-type materials include, but are not limited to the micro-pulling down method, Bridgman method, zone melt method, Edge-defined Film-fed Growth (EFG) method, and hot isostatic press (HIP) sintering method.

In any production method of crystals, an oxide or carbonate raw material can be used as a starting material. Thus, suitable starting materials for preparing the crystals include, but are not limited to, $Gd_2O_3$, $Y_2O_3$, $\alpha$-$Al_2O_3$, $CeO_2$, $Pr_6O_3$, $Li_2CO_3$, $Lu_2O_3$, $K_2CO_3$, $NaHCO_3$, and the like. In some embodiments, the starting materials include a $^6Li$ enriched lithium compound. When the crystal is used as a crystal for a scintillator, a high-purity raw material (e.g., having a purity of 99.99% or higher and/or not containing more than 1 ppm of an impurity) can be used. These starting materials can be weighed and mixed such that a desired composition is obtained at the time of forming a melt.

In some embodiments, the Czochralski technique (in which large single crystals are "pulled" from molten raw material) can be used to grow codoped rare-earth gallium crystal boules. Raw materials can be measured out and mixed, e.g., using a ball mill, etc., and the mixed powder placed into a crucible. Calcination can be performed at, for example, 1000 to 1700 degrees Celsius for several hours. Suitable crucible materials include platinum, iridium, rhodium, rhenium, and alloys thereof. A high frequency oscillator, a condensing heater, or a resistance heater can be used. Further, a flowing atmosphere of argon, helium, or nitrogen can be used. In some embodiments, an atmosphere of nitrogen with a small amount of oxygen (e.g., between about 0.1 to about 5 vol %) can be used.

In some embodiments, the presently disclosed materials can be provided as ceramics, for example, by using a hot press or hot isotatic press (HIP) method. In this method, the raw materials (e.g., $Gd_2O_3$, $Al_2O_3$, $Ga_2O_3$, cerium salt (e.g., cerium nitrate), etc.) can be measured out and mixed, e.g., using a ball mill, etc. Then the mixed powders can be put into a crucible (e.g., an alumina crucible) and calcination can be performed (e.g., at a temperature of 1200 to 1500 degrees Celsius (° C.) for several hours. In the case of the hot press method, after the calcination, press molding can be performed to get a formed object using a die, after granulating the powder using a sieve with a suitable aperture. Then, the formed object can be set to a carbon die, and hot press sintering can be performed in an inert gas atmosphere at, for example, 1500 to 1700° C. and at a pressure of 10 megapascals (MPa) to 80 MPa. In the case of the HIP method, calcination powder is ground using a ball mill etc., and press molding can be performed to get a formed object using a die. The obtained formed object can be densified by a cold isostatic press method, put into a sagger made of alumina, and calcination carried out at a temperature of, for example, 1500 to 1700° C., in an inactive gas atmosphere. HIP sintering can be further performed to the obtained ceramics at a pressure of 50 MPa or higher, and at a temperature of 1300 to 1700° C.

The scintillation materials can be provided as single crystals, as a polycrystalline material, and/or as a ceramic material. In some embodiments, the material is provided as a polycrystalline and/or ceramic material. The polycrystalline and/or ceramic material can have analogous physical, optical and scintillation properties as a single crystal otherwise having the same chemical composition.

In some embodiments, the method further comprises annealing the scintillator material for a period of time (e.g., between a few hours and a few days). The annealing can be performed, for example, in air, nitrogen, or a mixture of nitrogen and hydrogen. The annealing can be done at any suitable temperature, e.g., between about 800 and about 1600 degrees Celsius (e.g., about 800, 900, 1000, 1100, 1200, 1300, 1400, 1500, and about 1600 degrees Celsius). In some embodiments, the annealing increases the light yield of the material and/or provides a material with a faster scintillation decay time. In some embodiments, the annealing is performed in air. In some embodiments, the annealing is performed at a temperature of about 1200° C. and/or for a time period of about 48 hours.

V. Methods of Altering Scintillation and/or Optical Properties

In some embodiments, the presently disclosed subject matter provides a method of altering one or more scintillation and/or optical properties of a garnet-type scintillation material, such as, but not limited to, scintillation light yield, decay time, rise time, energy resolution, proportionality, and sensitivity to light exposure. In some embodiments, the method comprises preparing the garnet-type scintillation material in the presence of a dopant ion and one or more monovalent codopant ions. In some embodiments, the garnet-type scintillation material is a rare earth aluminum garnet. In some embodiments, the garnet-type scintillation material is a mixed rare earth aluminum garnet and comprises a matrix having the formula $RE''_3Al_5O_{12}$, wherein RE" is a mixture of at least two rare earth elements and wherein the scintillator further comprises at least one dopant selected from the group comprising Ce, Pr, Nd, Sm, Eu, Gd, Tb, Yb, Bi, Sb, and any combination thereof, subject to the proviso that the dopant does not comprise an ion of the same element as any rare earth element of the rare earth aluminum garnet matrix. In some embodiments, the at least one dopant is selected from the group comprising Pr, Nd, Sm, Eu, Gd, Tb, Yb, Bi, Sb, and any combination thereof. In some embodiments, the matrix is doped with 5 at % of less of the dopant compared to the rare earth elements. In some embodiments, the amount of codopant is 10 at % or less compared to the rare earth element and dopant content. In some embodiments, RE" comprises Lu and at least one other type of rare earth element. In some embodiments, the at least one other type of rare earth element is other than Eu or Pr. In some embodiments, the dopant is Eu or Pr. In some embodiments, the dopant is Pr.

In some embodiments, the monovalent codopant ion is an alkali metal ion. In some embodiments, the monovalent codopant ion is selected from $Li^+$, $Na^+$, and $K^+$. In some embodiments, the monovalent codopant ion is $Li^+$.

In some embodiments, the garnet-type scintillation material is a lutetium aluminum garnet (LuAG) or a lutetium yttrium aluminum garnet (LuYAG). In some embodiments, the garnet-type scintillation material is a lutetium aluminum garnet (LuAG) wherein at least some of the Lu is replaced by another rare earth element. In some embodiments, the garnet-type scintillation material is a lutetium yttrium aluminum garnet (LuYAG).

In some embodiments, the codoping provides increased light yield and/or improved energy resolution. In some embodiments, the codoping provides a rare earth aluminum garnet scintillator material with energy resolution at 662 keV of about 4.8% or less. In some embodiments, the codoping provides a rare earth aluminum garnet scintillator material with energy resolution at 662 keV of about 4.4% or less. In some embodiments, the codoping provides a rare earth aluminum garnet scintillator material with energy resolution at 4.1%. In some embodiments, the codoping provides a rare earth aluminum garnet scintillator material with a faster decay time.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Example 1

0.2% Li Codoped LuYAG:Pr $[Lu_{1-x}Y_x]_{1-y-z}A_yB_z]_3Al_5O_{12}$ was prepared where A is $Pr^{3+}$ and B is $Li^+$. High purity raw materials were mixed and loaded directly into a 60 mm diameter iridium crucible according to the respective stoichiometric formulas. Czochralski crystal growth was carried out in a Cyberstar Oxypuller growth station (Cyberstar, Echirolles, France), using an automated system in which the derivative of the crystal weight was the process variable, to produce ~490 gram boules of the nominal composition ($Lu_{0.748}$, $Y_{0.25}$, $Pr_{0.004}$, $Li_{0.002}$)$_3Al_5O_{12}$. Crystal growth was initiated on LuAG:Ce seed crystals oriented in the <111> direction. The atmosphere was primarily nitrogen with a small fraction of a percent oxygen. The results were transparent single crystals that were cut into 5×5×5 mm pixels and 1 mm×33 mm diameter slabs for measurements. The example of the type is presented below compared to previously reported doped garnet single crystals. See Table 1.

TABLE 1

Noncodoped LuAG and LuYAG and LuYAG:Pr Codoped with 0.2% Li.

| Composition | Light output (ph/MeV) | Absorbance (nm) | RL Max emission (nm) | Primary Decay time (ns) |
|---|---|---|---|---|
| ($Lu_{0.744}$, $Y_{0.25}$, $Pr_{0.004}$, $Li_{0.002}$)$_3Al_5O_{12}$ | 16,000 | 240, 285 | 330, 378 | 22 ns |
| LuAG:Pr[1] | 12,000-14,000 | 240, 285 | 325, 383 | 25 ns |
| LuYAG:Pr[2] | 27,000 | Not available | 286-450 range | 27 ns |

[1]values obtained from Nikl et al., Physical Status Solidi (a), 202(1), R4-R6 (2005).
[2]Values obtained from Drozdowski et al., Optical Materials, 59, 107-114 (September 2016).

Figure 2:
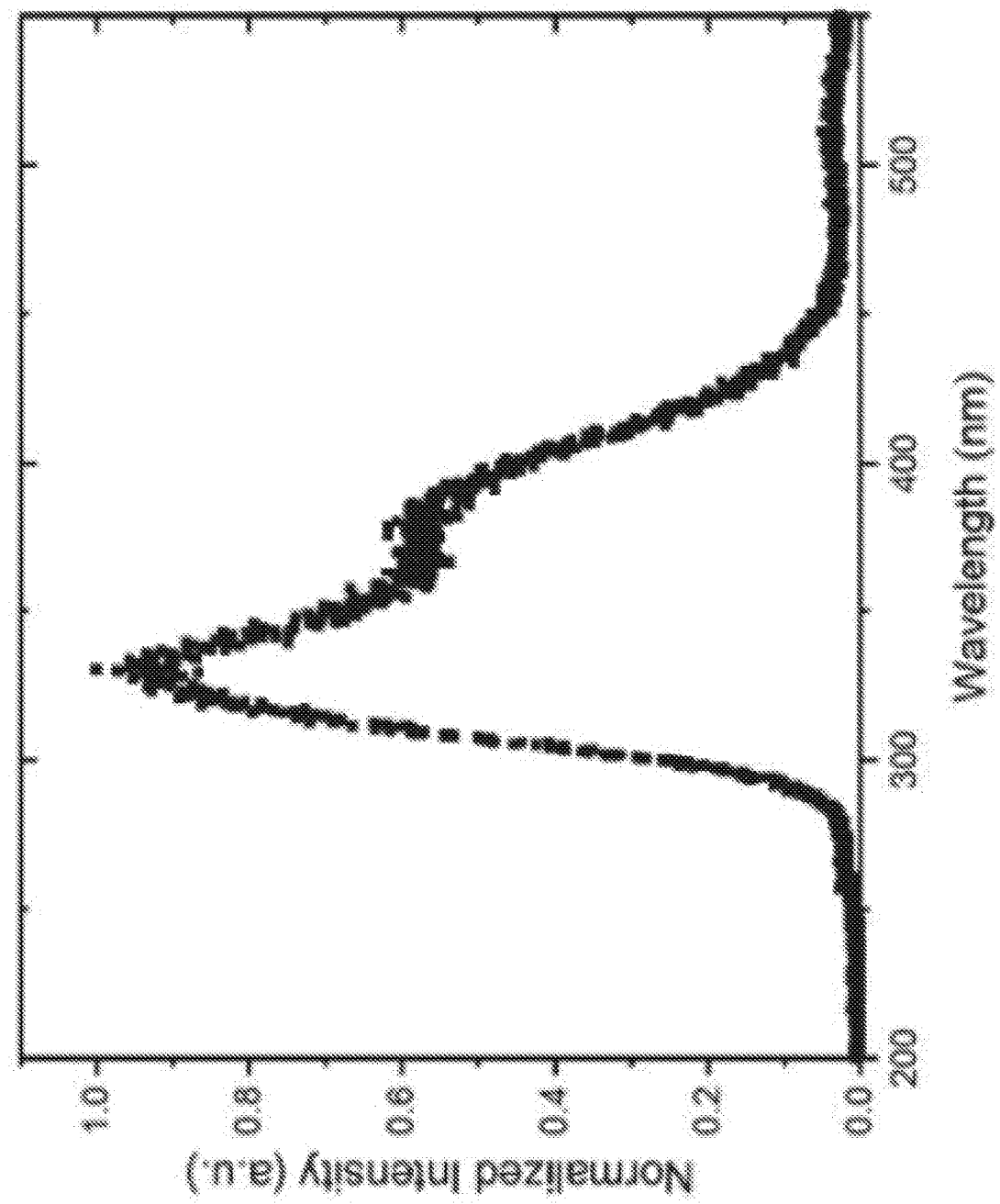
FIG. 2 is a graph of the X-ray excited luminescence (or radioluminescence (RL)) spectra (normalized intensity (in arbitrary units (a.u.)) versus wavelength (in nanometers (nm))) of a lutetium aluminum oxide single crystal where about 25 percent of the lutetium is replaced by yttrium and where the material is doped with 0.4 atomic percent (at %) praseodymium and codoped with 0.2 at % lithium (i.e., $Lu_{0.744}Y_{0.25}Pr_{0.004}Li_{0.002})Al_5O_{12}$).

Absorbance measurements were completed using a Varian Cary 5000 UV-Vis-NIR Spectrophotometer (Varian Inc., Palo Alto, Calif., United States of America) on polished samples about 1 mm thick. The wavelengths of peaks observed in the absorbance spectrum shown in FIG. 1 are attributed to characteristic absorbance of the activator, verifying the charge states that are present within the material. Radioluminescence (RL) spectra were measured at room temperature under continuous irradiation from an X-ray generator model CMX003 (32 kV and 0.1 mA). A model PI Acton Spectra Pro SP-2155 monochromator (Princeton Instruments, Acton Mass., United States of America) was used to record the spectra. The single peak emission peak observed in the RL spectra shown in FIG. 2 is attributed to characteristic emission of activator transitions.

Figure 3:
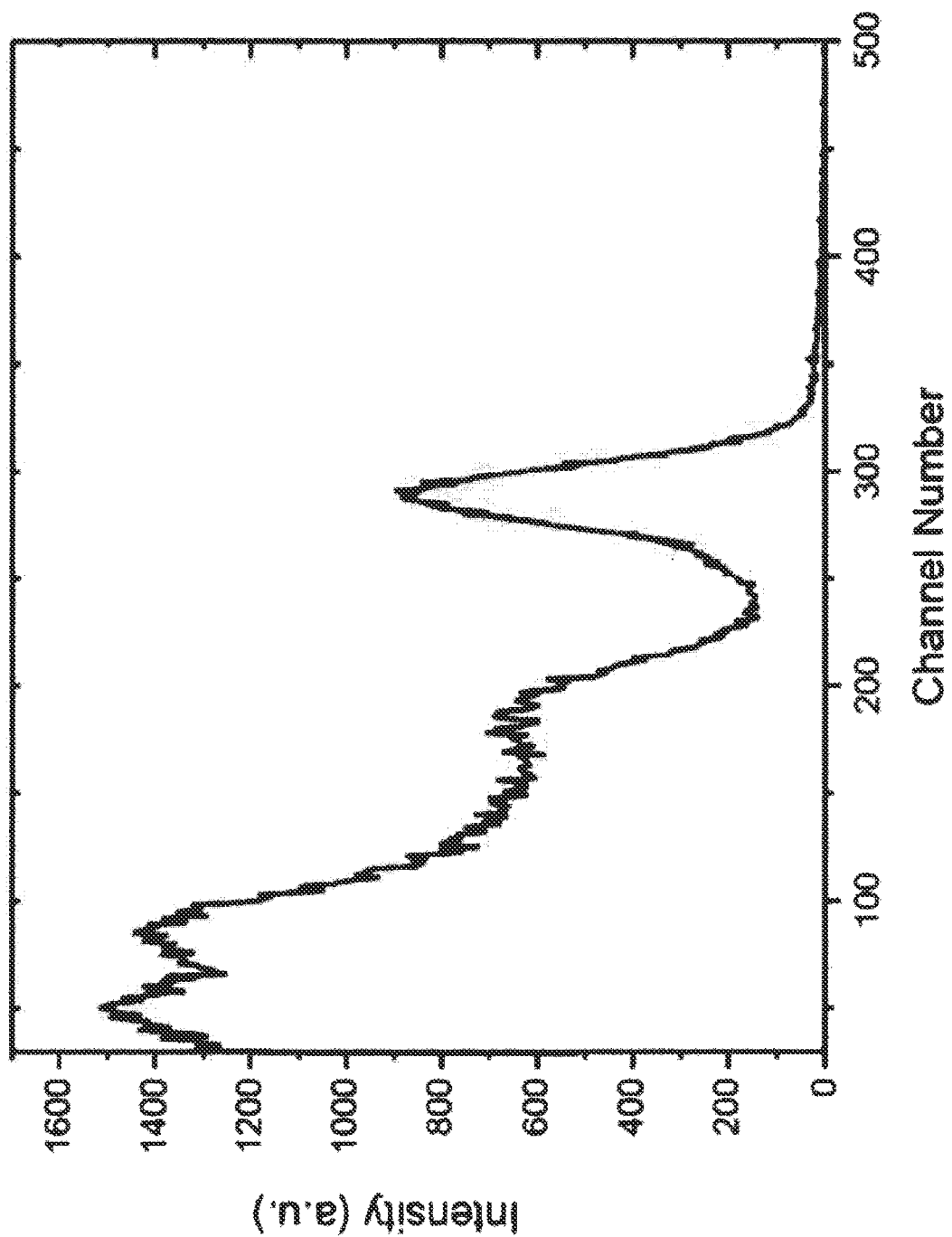
FIG. 3 is a graph of the gamma (γ)-ray spectra (intensity (in arbitrary units (a.u.)) versus channel number) of a lutetium aluminum oxide single crystal where about 25 percent of the lutetium is replaced by yttrium and where the material is doped with 0.4 atomic percent (at %) praseodymium and codoped with 0.2 at % lithium (i.e., $Lu_{0.744}Y_{0.25}Pr_{0.004}Li_{0.002})Al_5O_{12}$). Light yield is 16,000 photons per megaelectronvolt (MeV) based on a Gaussian fit of the data between about channel 250 and about channel 330. The x-ray source was 10 microcurie (μCi) of cesium-137 ($^{137}$Cs; 662 kiloelectronvolts (keV)).
Figure 4:
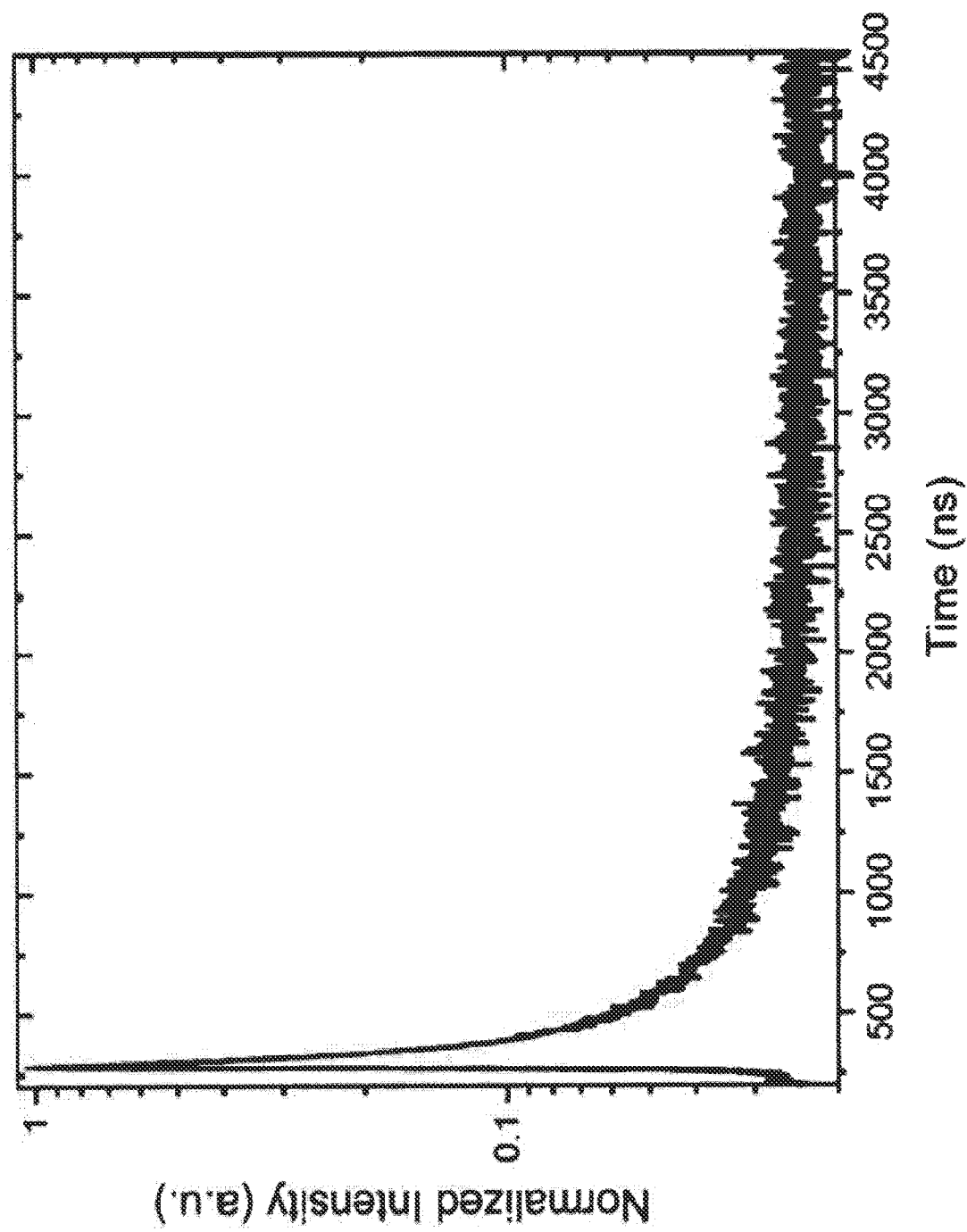
FIG. 4 is a graph showing the scintillation time profile (normalized intensity (in arbitrary units (a.u.)) versus time (in nanoseconds (ns))) of a lutetium aluminum oxide single crystal where about 25 percent of the lutetium is replaced by yttrium and where the material is doped with 0.4 atomic percent (at %) praseodymium and codoped with 0.2 at % lithium (i.e., $Lu_{0.744}Y_{0.25}Pr_{0.004}Li_{0.002})Al_5O_{12}$). Decay times for a three-component exponential decay fit were 22 nanoseconds (ns) (40 percent (%)), 656 ns (31%), and 119.1 ns (29%).

Light output measurements are shown in FIG. 3. A Hamamatsu bialkali R2059 photomultiplier tube (PMT, Hamamastu Photonics, K.K., Hamamatsu City, Japan), an Ortec 672 amplifier (Advanced Measurement Technology, Inc., Oak Ridge, Tenn., United States of America), a Canberra model 2005 pre-amplifier (Canberra Industries, Ind., Meridan, Conn., United States of America), and a Tukan 8 k multi-channel analyzer (MCA, National Center for Nuclear Research, Świerk, Poland) were the components of the pulse processing chain. See Guzik et al., IEEE Transactions on Nuclear Science, 53(1), 231-235 (2006). The sample was excited with a 10 μCi Cs-137 (662 keV) source and was coupled to the PMT with Corning optical grease. Light capture was enhanced by covering five sides of each sample with multiple layers of TEFLON® tape, and a reflective SPECTRALON® dome (Labsphere, North Sutton, N.H., United States of America) was placed on top. The photopeaks were fitted with a Gaussian function to determine the centroid of the peak. The integral quantum efficiency of PMT according to the emission spectrum of the scintillator was used to estimate the light output in photons per unit of gamma-ray energy. Scintillation decay time was recorded using a $^{137}$Cs source and the time-correlated single photon counting technique previously described in Bollinger and Thomas (Review of Scientific Instruments, 32, 7, (1961)). The decay curves shown in FIG. 4 were fitted with a three-component exponential decay function. The decay times were 22 nanoseconds (ns) (40 percent (%)), 656 ns (31%), and 119.1 ns (29%).

Both the light yield and decay time were modified with the addition of lithium to a LuYAG:Pr single crystal scintillator. A particular improvement was found in the acceleration of the primary decay component. It is believed that these results are not limited to this compound and can be applied to other garnet scintillators, such as LuGAG:Ce and LuGAG:Pr, as well as to related polycrystalline and/or ceramic scintillators.

Example 2

Additional Codoped LuYAG:Pr Materials

Boules of 0.4 at % praseodymium-doped LuYAG, with a ratio of Lu to Y of 3:1, and Li concentrations of 0 at %, 0.2 at %, 0.8 at % and 2.0 at % and boules of 1.2 at % Pr-doped LuYAG with a ratio of Lu to Y of 3:1 and lithium concentrations of 0 at %, 0.6 at %, 2.4 at %, and 6 at % with respect to the rare earth element were grown via the Czochralski growth method in a Cyberstar Oxypuller growth station (Cyberstar, Echirolles, France) using an automated system in which the derivative of the crystal weight was the process variable. The $Lu_2O_3$, $Al_2O_3$, $Y_2O_3$, $Pr_2O_3$, and $Li_2CO_3$ raw materials were added directly to a 60 mm diameter iridium crucible. In addition, boules of a 1.2 at % Pr-doped LuYAG with a ratio of Lu to Y of 3:1 and a potassium concentration of 0.6 at % or a sodium concentration of 0.308 at % with respect to the rare earth element were grown.

Figure 5:
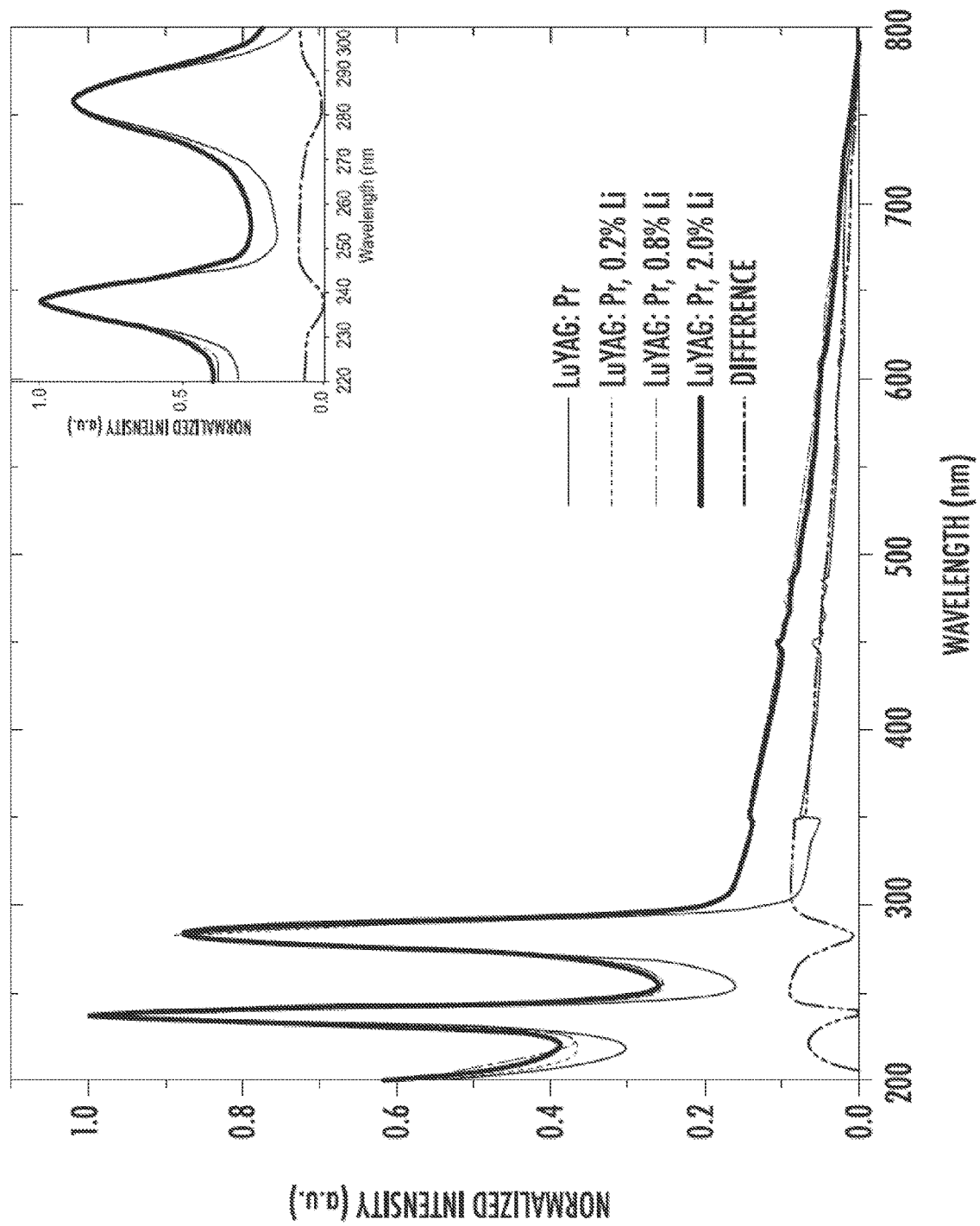
FIG. 5 is a graph of the absorbance spectra of (normalized intensity (in arbitrary units (a.u.)) versus wavelength (in nanometers (nm))) of a lutetium aluminum oxide single crystal where about 25 percent of the lutetium is replaced by yttrium and where the material is doped with 0.4 atomic percent (at %) praseodymium (Pr) and codoped with lithium (Li). Spectra are shown for a crystal codoped with 0.2 at % Li (LuYAG:Pr, 0.2% Li, dashed line), a crystal codoped with 0.8 at % Li (LuYAG:Pr, 0.8% Li, dashed and dotted line), and a crystal codoped with 2.0 at % Li (LuYAG:Pr, 2.0% Li, heavy solid line). For comparison, the spectrum for a Pr doped material free of codopant (LuYAG:Pr, thin solid line) is also shown. In addition, the difference between the spectra for the codoped samples and the spectrum for the non-codoped sample is shown in the dashed and double dotted line. The inset shows an expanded view of the spectra between 220 nm and 300 nm.
Figure 6:
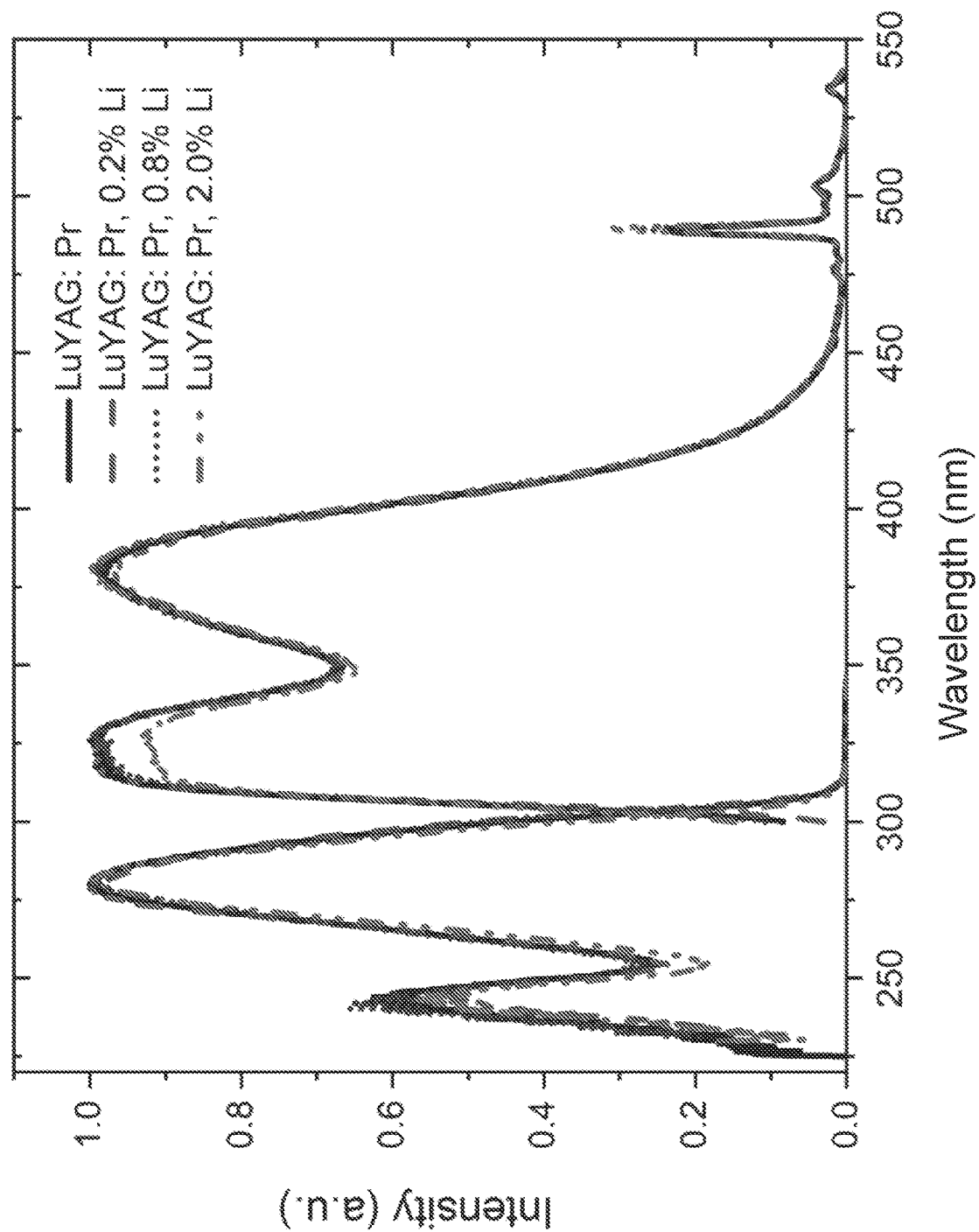
FIG. 6 is a graph showing the photoluminescence spectra (in intensity (in arbitrary units (a.u.)) versus wavelength (in nanometers (nm))) of a lutetium aluminum oxide single crystal where about 25 percent of the lutetium is replaced by yttrium and where the material is doped with 0.4 atomic percent (at %) praseodymium (Pr) and codoped with lithium (Li). Spectra are shown for a crystal codoped with 0.2 at % Li (LuYAG:Pr, 0.2% Li, dashed line), a crystal codoped with 0.8 at % Li (LuYAG:Pr, 0.8% Li, dotted line), and a crystal codoped with 2.0 at % Li (LuYAG:Pr, 2.0% Li, dashed and dotted line). For comparison, the spectra of a Pr doped material free of codopant (LuYAG:Pr, solid line) is also shown. Excitation is at 375 nm and the main emission peak at 280 nm.

Absorbance measurements were completed using a Varian Cary 5000 UV-Vis-NIR Spectrophotometer (Varian Inc., Palo Alto, Calif., United States of America) on polished samples about 1 mm thick. The wavelengths of peaks observed in the absorbance spectra shown in FIG. 5 are attributed to characteristic absorbance of the activator, verifying the charge states that are present within the material. The optical properties of the praseodymium activation in the noncodoped and codoped is represented by the photoluminescence (PL) excitation and emission spectra in FIG. 6. PL emission and excitation spectra were acquired with a Horiba Jobin Yvon Flurolog-3 spectrofluorometer (Horiba, Kyoto, Japan) using a 450 Watt (W) continuous Xe lamp as the excitation source. The excitation of the activator was measured at 240 and 280 nm. As shown in FIG. 6, the wavelength of excitation and emission does not change with the incorporation of lithium into the matrix as a codopant.

Figure 7:
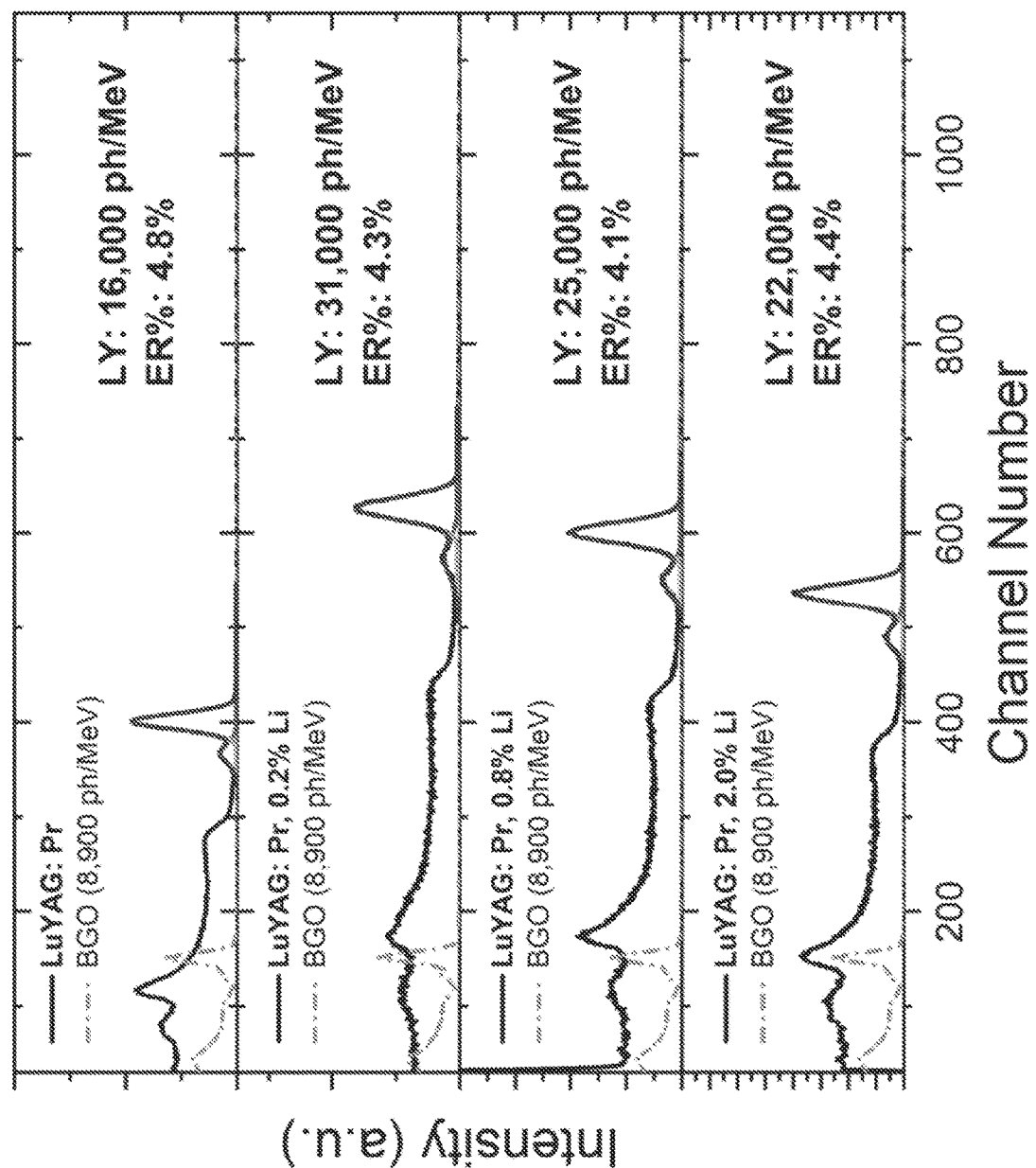
FIG. 7 is a graph showing the gamma ray spectra (in intensity (in arbitrary units (a.u.)) versus channel number for, from top to bottom, a lutetium aluminum oxide single crystal where about 25 percent of the lutetium is replaced by yttrium and where the material is doped with 0.4 atomic percent (at %) praseodymium (Pr) (LuYAG:Pr); a crystal of the same material also codoped with 0.2 at % lithium (Li) (LuYAG:Pr, 0.2% Li); a crystal of the same material also codoped with 0.8 at % Li (LuYAG:Pr, 0.8% Li); and a crystal of the same material also codoped with 2.0 at % Li (LuYAG:Pr, 20% Li). The spectra of each LuYAG crystal is shown as a solid line. For comparison, the spectra of bismuth germanate (BGO) is shown as a dashed line.

Light output measurements of some of the 0.4 at % Pr doped Li codoped samples are shown in FIG. 7. The absolute light yield was determined from pulse height spectra for each composition using a pulse processing chain consisting of a super bialkali R2059 photomultiplier tube (PMT, Hamamatsu Photonics, K.K., Hamamatsu City, Japan), an ORTEC® 672 amplifier (Advanced Measurement Technology, Inc., Oak Ridge, Tenn., United States of America), a Canberra model 2005 pre-amplifier (Canberra Industries, Ind., Meridan, Conn., United States of America) and a Tukan 8 k multi-channel analyzer (MCA, National Center for Nuclear Research, Świerk, Poland). Each sample was excited with a 10 µCi Cs-137 (662 keV) source and was coupled to the PMT with Corning optical grease. Light capture was enhanced by covering five sides of each sample with multiple layers of Teflon tape, and a reflective SPECTRALON® dome (Labsphere, North Sutton, N.H., United States of America) was placed on top. The photopeaks were fitted with a Gaussian function to determine the centroid of the peak. The integral quantum efficiency of PMT according to the emission spectrum was used to estimate the light output in photons per unit of gamma-ray energy.

The simplified description of energy resolution can be described as the ratio of the full width half maximum of the photopeak divided by the centroid position of the gaussian as shown in Equation 1; however, other factors, such as nonproportionality, or the scintillators performance along a range of energies also plays a role in the energy resolution (see Knoll, Radiation Dectectoin and Measurement, John Wiley & Sons, 2010; and Dorenbos et al., IEEE Transactions on Nuclear Science, 42(6), 2190-2202 (1995):

$$R = \frac{FWHM}{H_O} \qquad (1)$$

Figure 8:
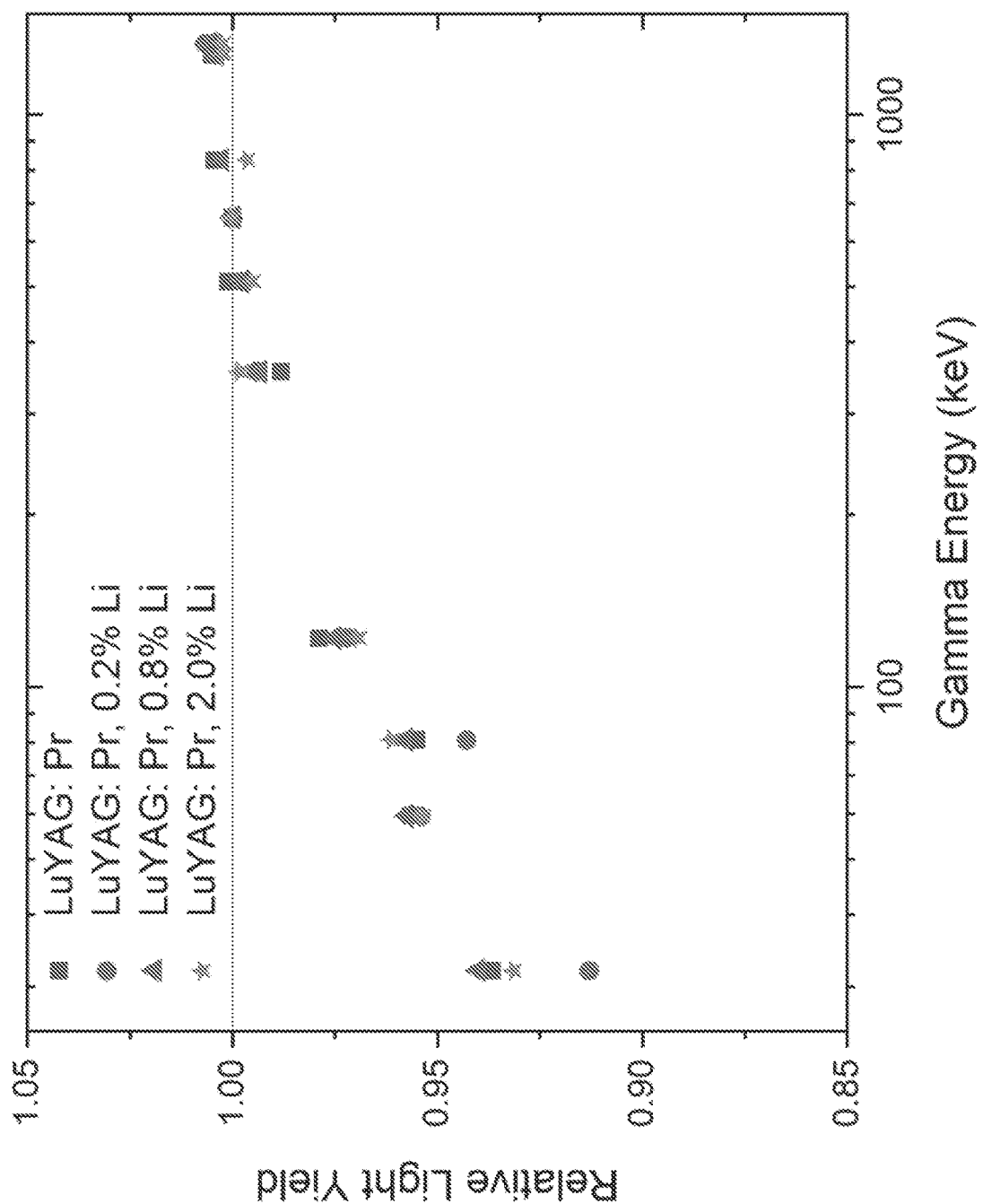
FIG. 8 is a graph showing the gamma response (relative light yield versus gamma energy (in kiloelectronvolts (keV)) for praseodymium (Pr) doped lutetium yttrium aluminum oxide (LuYAG:Pr, squares), Pr doped LuYAG codoped with 0.2 atomic percent (at %) lithium (LuYAG:Pr, 0.2% Li, circles); Pr doped LuYAG codoped with 0.2 at % lithium (LuYAG:Pr, 0.8% Li, triangles); and Pr doped LuYAG codoped with 2.0 at % lithium (LuYAG:Pr, 2.0% Li, stars). The ideal response would follow the solid line.

The relative light yield at gamma energies ranging from 32 to 1333 keV was collected on 5×5×5 mm samples taken from a similar position along the boule length. FIG. 8 depicts the nonproportional response to gamma energies for some 0.4 at % Pr doped Li codoped samples with different lithium concentrations. Scintillation decay times were measured using two R2059 Hamamatsu PMTs (Hamamatsu Photonics, K.K., Hamamatsu City, Japan) and a $^{137}$Cs gamma source in the configuration described by Bollinger and Thomas (Review of Scientific Instruments, 32, 7 (1961).

Discussion:

Table 2 below summarizes the data collected for the additional LuYAG samples prepared. In Table 2, the symbol ** means that the measurement has not yet been made. Dopant and codopant concentrations are nominal concentrations added directly to the melt inside the crucible.

TABLE 2

Additional Noncodoped and Codoped LuYAG Samples.

| Sample # | Dopant Conc. | Codopant Conc. | LY ph/MeV | ER (%) | Fast $\tau_d$ (ns) |
|---|---|---|---|---|---|
| S-181 | 0.2 at % Pr | none | 30,000 | 4.7 | 62.8 |
| S-215 | 0.4 at % Pr | 0.2 at % Li | 16,000 | ** | 22 |
| S-216 | 0.4 at % Pr | none | 16,000 | 4.8 | 41.3 |
| S-217 | 0.4 at % Pr | 0.8 at % Li | 25,000 | 4.1 | 48.4 |
| S-220 | 0.4 at % Pr | 2.0 at % Li | 22,000 | 4.4 | 49.6 |
| S-223 | 0.4 at % Pr | 0.2 at % Li | 31,000 | 4.3 | 45.9 |
| S-226 | 1.2 at % Pr | 2.4 at % Li | 17,000 | 4.8 | 22.2 |
| S-227 | 1.2 at % Pr | 6 at % Li | 26,000 | 4.3 | 30.6 |
| S-229 | 1.2 at % Pr | 0.6 at % Li | ** | ** | ** |
| S-231 | 1.2 at % Pr | 0.6 at % K | ** | ** | ** |
| S-233 | 1.2 at % Pr | 0.308 at % Na | ** | ** | ** |

As can be observed by comparing the results from Samples S-181 and S-216, higher concentrations of dopant (e.g., Pr) yield higher light yield but slower decay time ($\tau_d$). The original 0.4 at % Pr doped, 0.2 at % Li codoped sample (S-215) described in Example 1 had a smaller crystal size than other growths and, therefore, re-synthesized (i.e., sample S-223). It is the data from the re-synthesized S-223 sample that is shown in FIGS. 5-8.

By comparing the different 0.4 at % Pr doped samples (S-216, S-223, S-217, and S-220), it appears that adding a monovalent dopant (e.g., lithium) to LuYAG:Pr scintillators can improve both light yield and energy resolution when the dopant concentration is low. In particular, at 662 keV gamma energy, the energy resolution of the S-217 sample (0.8 at % Li) is 4.1%, which is a breakthrough for oxide scintillators and challenges the values obtained by that of NaI:Tl (6.7%), CsI:Tl (6.6%), and even LuAG:Pr reported at 4.6%. See Suzuki et al., Applied Physics Express, 5(10), 102601 (2012); and Khodyuk et al., IEEE Transactions on Nuclear Science, 57(3) 1175-1181 (2010). Higher at % of lithium codopant (e.g., 1.0 at %) do not show as great an influence on light yield and energy resolution as lower codopant amounts (e.g., 0.2 at % and 0.8 at %). The greatest increase in light yield was seen with the 0.1 at % Li codoped, 0.4 at % Pr doped sample (S-223). In general, it appears that the codopant has a lesser effect on light yield and energy resolution when the dopant amount is higher (e.g. 1.2 at %).

Summary:

The effects of codoping on rare earth aluminum garnets, such as materials of the type $[Lu_{1-x}RE_x)_{1-y-z}A_yB_z]Al_5O_{12}$, with a monovalent atom are described. The light yield, energy resolution, and decay time of a Pr doped LuYAG single crystal scintillator can be modified with the addition of lithium. Particular improvements were found in the increase of the light yield and the improvement in energy resolution. In some cases, there was an acceleration of the fast decay time component. It is expected that further tuning of the dopant and codopant concentrations, as well as the type of dopant (e.g, Pr or Ce) and dodopant (e.g., Li, Na or K) will permit production of scintillator crystals with a desired light yield, energy resolution and decay time. It is expected that these results are not limited to the LuYAG matrix and can be applied to other garnet scintillators, such as LuGAG:Ce and LuGAG:Pr, as well as to ceramic scintillators.

Example 3

Annealing of Codoped Scintillators

Light output and scintillation decay time measurements were completed on samples described in Example 2 of 0.4 at % Pr-doped LuYAG with a ratio of Lu to Y of 3:1 and a lithium concentration of 0 at %, 0.2 at %, 0.8 at % or 2 at % with respect to the rare earth element. After preliminary measurements were completed, each sample was annealed in an oxidizing atmosphere (i.e. air) for a length of time (i.e. 48 hours) at a high temperature (i.e. 1200° C.). After this annealing cycle, the light output and scintillation decay time measurements were repeated. Each sample was kept in a tin container to prevent exposure to light before each measurement.

To analyze the impact of codoping and thermal annealing on the defect structure of the LuYAG: Pr, Li single crystals, thermoluminescence studies were also completed. Samples of 5×5×5 mm dimension were cooled to a temperature of 15K before excitation from an x-ray source with power settings of 30 kV and 0.1 mA. After 15 minutes of excitation, the x-ray source was turned off, and the temperature was raised from 15K to 550K at a rate of 3 K/min. The release of electrons from deep traps within the lattice is seen as a peak on the thermoluminescence glow curve and can be observed in FIG. 10, before and after each sample was annealed in air.

Figure 10:
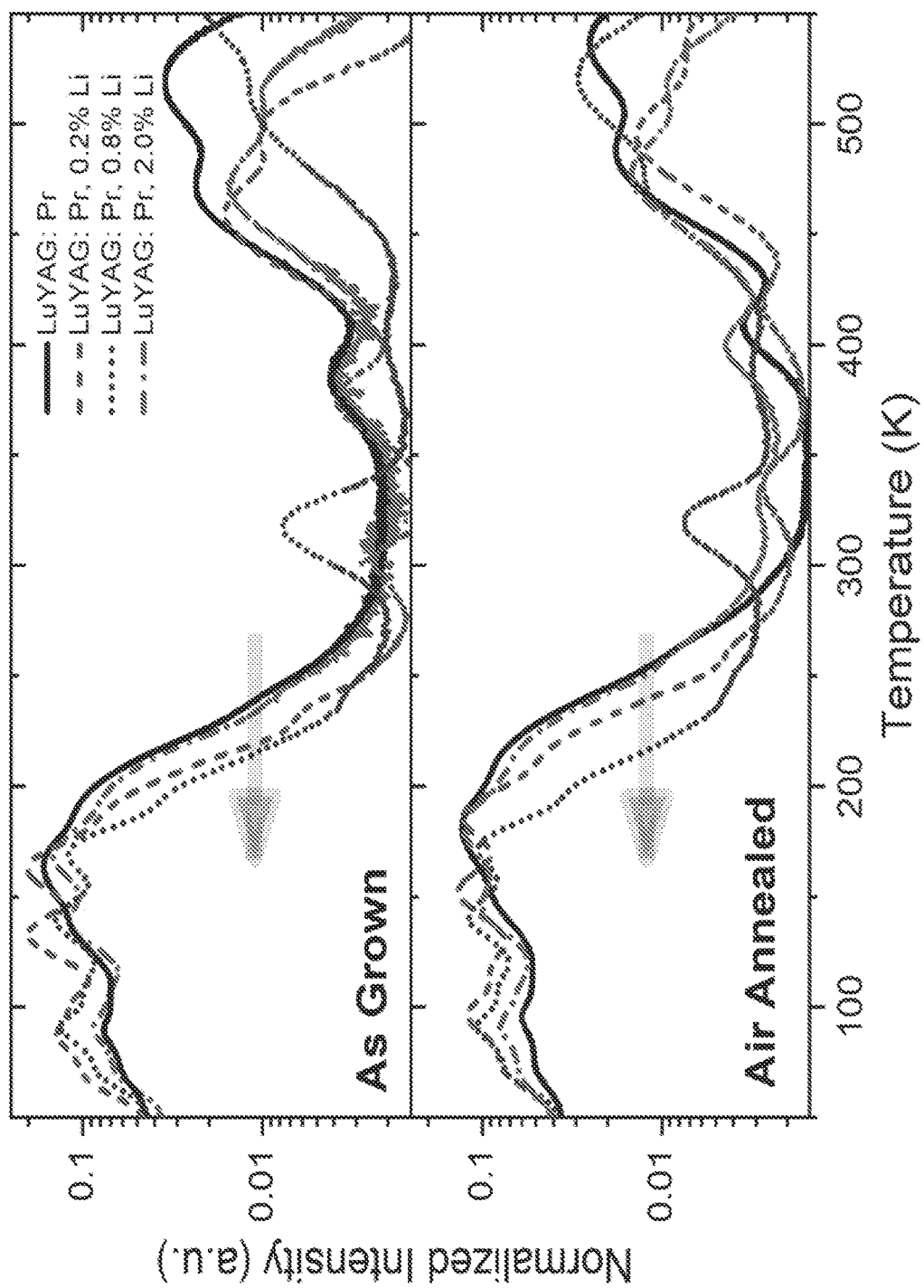
FIG. 10 is a pair of graphs showing the thermoluminescence glow curves (normalized intensity in arbitrary units (a.u.) versus temperature in Kelvin (K)) of as grown (top) and air annealed (bottom) 0.4 atomic percent (at %) praseodymium (Pr) doped lutetium yttrium aluminum oxide (LuYAG:Pr, solid lines), 0.4 at % Pr doped LuYAG codoped with 0.2 at % lithium (LuYAG:Pr, 0.2% Li, dashed lines); 0.4 at % Pr doped LuYAG codoped with 0.8 at % lithium (LuYAG:Pr, 0.8% Li, dotted lines); and 0.4 at % Pr doped LuYAG codoped with 2.0 at % lithium (LuYAG:Pr, 2.0% Li, dashed and dotted lines). The grey arrows emphasize a lowering in intensity of the peaks below about 250 K in the lithium codoped samples.

The effect of annealing LuYAG: Pr, Li samples in air on light yield, energy resolution, and decay times is summarized in Table 3, below. As indicated in Table 3, annealing in air for 48 h at 1200° C. can improve the scintillation light yield and decay time. The energy resolution was not improved with air annealing; however, for all samples containing lithium as a codopant, the energy resolution remained below 5%. Thermoluminescence measurements were completed on all the samples before and after the thermal treatment. As shown in FIG. 10, after thermal annealing the peaks below ~250 K lowered in intensity for lithium codoped LuYAG:Pr single crystals.

TABLE 3

Effects of Annealing on Codoped LuYAG.

| Li Conc. (annealing status) | Relative LY (% versus BGO) | ER (%) | τ1 (ns) | τ2 (ns) | τ3 (ns) |
|---|---|---|---|---|---|
| 0 at % (as grown) | 279 | 4.8 | 41.3 | 322.3 | 1328.2 |
| 0 at % (annealed) | 343 | 5.1 | 41.8 | 350.3 | 1481.1 |
| 0.2 at % (as grown) | 559 | 4.3 | 46.4 | 395 | 1470.1 |
| 0.2 at % (annealed) | 591 | 4.5 | 45.9 | 360.3 | 1410 |
| 0.8 at % (as grown) | 459 | 4.1 | 48.4 | 379.4 | 1444.4 |
| 0.8 at % (annealed) | 551 | 4.5 | 44.9 | 298.7 | 1177.3 |
| 2.0 at % (as grown) | 457 | 4.4 | 49.6 | 404.3 | 1513.8 |
| 2.0 at % (annealed) | 498 | 4.6 | 41.3 | 325 | 1356.5 |

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A scintillator material comprising a composition of Formula (III):

$$[(Lu_{1-x}Y_x)_{1-y-z}A_yB_z]_3Al_5O_{12} \qquad (III),$$

wherein:

$0.2 \le x \le 0.3$;

$0.004 \le y \le 0.015$;

$0.001 \le z \le 0.1$;

A is $Pr^{3+}$; and

B is at least one type of monovalent cation, wherein the monovalent cation is a cation of an element selected from the group consisting of Li, Na, and K.

2. The scintillator material of claim 1, wherein x is 0.25.

3. The scintillator material of claim 1, wherein y is 0.004 or 0.012.

4. The scintillator material of claim 1, wherein B is $Li^+$.

5. The scintillator material of claim 1, wherein z is 0.002, 0.008, or 0.02.

6. The scintillator material of claim 1, wherein the scintillator material comprises a material selected from the group consisting of $(Lu_{0.75}, Y_{0.25})_3Al_5O_{12}$:0.4% $Pr^{3+}$ codoped with 0.2% $Li^+$, $(Lu_{0.75}, Y_{0.25})_3Al_5O_{12}$:0.4% $Pr^{3+}$ codoped with 0.8% $Li^+$, $(Lu_{0.75}, Y_{0.25})_3Al_5O_{12}$:0.4% $Pr^{3+}$ codoped with 2.0% $Li^+$; $(Lu_{0.75}, Y_{0.25})_3Al_5O_{12}$:0.1.2% $Pr^{3+}$ codoped with 0.308 at % $Na^+$, $(Lu_{0.75}, Y_{0.25})_3Al_5O_{12}$:1.2% $Pr^{3+}$ codoped with 0.6 at % $Li^+$, $(Lu_{0.75}, Y_{0.25})_3Al_5O_{12}$:1.2% $Pr^{3+}$ codoped with 0.6 at % $K^+$, $(Lu_{0.75}, Y_{0.25})_3Al_5O_{12}$:1.2% $Pr^{3+}$ codoped with 2.4 at % $Li^+$, and $(Lu_{0.75}, Y_{0.25})_3Al_5O_{12}$: 1.2% $Pr^{3+}$ codoped with 6 at % $Li^+$.

7. The scintillator material of claim 6, wherein the material is selected from the group consisting of $(Lu_{0.75},$ $Y_{0.25})_3Al_5O_{12}$:0.4% $Pr^{3+}$ codoped with 0.2% $Li^+$, $(Lu_{0.75}, Y_{0.25})_3Al_5O_{12}$:0.4% $Pr^{3+}$ codoped with 0.8% $Li^+$, and $(Lu_{0.75}, Y_{0.25})_3Al_5O_{12}$:0.4% $Pr^{3+}$ codoped with 2.0% $Li^+$.

8. The scintillator material of claim 6, wherein the material is $(Lu_{0.75}, Y_{0.25})_3Al_5O_{12}$:0.4% $Pr^{3+}$ codoped with 0.8% $Li^+$.

9. The scintillator material of claim 1, wherein the scintillator material exhibits one or more of increased light yield, improved energy resolution, and an accelerated fast decay component as compared to the scintillator material where B is absent.

10. The scintillator material of claim 1, wherein the scintillator material is a single crystal material.

11. The scintillator material of claim 1, wherein the scintillator material is a polycrystalline and/or a ceramic material.

12. A radiation detector comprising a photon detector and a scintillation material of claim 1.

13. The radiation detector of claim 12, wherein the detector is a medical diagnostic device, a device for oil exploration, or a device for container or baggage scanning.

14. A method of detecting gamma rays, X-rays, cosmic rays and/or particles having an energy of 1 keV or greater, the method comprising: providing a radiation detector of claim 12; positioning the radiation detector, wherein the positioning comprises placing the radiation detector in a location wherein the scintillation material is in a path of a beam of radiation or a suspected path of a beam of radiation; and detecting light emitted by the scintillation material with the photon detector.

15. A method of preparing a scintillator material of claim 1, wherein the method comprises pulling a single crystal from molten raw materials.

16. The scintillator material of claim 1, wherein the scintillator material has an energy resolution at 662 keV of less than 4.4%.

17. The scintillator material of claim 16, wherein the scintillator material has an energy resolution at 662 keV of 4.3% or less.

18. The scintillator material of claim 16, wherein the scintillator material has an energy resolution at 662 keV of 4.1%.

19. A method of improving energy resolution of a rare earth aluminum garnet scintillator, wherein the rare earth aluminum garnet scintillator is a praseodymium (Pr) doped lutetium yttrium aluminum garnet (LuYAG) scintillator, wherein the method comprises preparing a scintillator material comprising a composition of Formula (III):

$$[(Lu_{1-x}Y_x)_{1-y-z}A_yB_z]_3Al_5O_{12} \quad (III),$$

wherein:
  $0.2 \leq x \leq 0.3$;
  $0.004 \leq y \leq 0.015$;
  $0.001 \leq z \leq 0.1$;
  A is $Pr^{3+}$; and
  B is at least one type of monovalent cation, wherein the monovalent cation is a cation of an element selected from the group consisting of Li, Na, and K.

20. A scintillator material comprising a composition of Formula (I'):

$$[(RE_{1-x}RE'_x)_{1-y-z}A_yB'_z]_3Al_5O_{12} \quad (I'),$$

wherein:
  $0.2 \leq x \leq 0.3$;
  $0.004 \leq y \leq 0.015$;
  $0.001 \leq z \leq 0.1$;
  RE is Lu;
  RE' is Y;
  A is $Pr^{3+}$; and
  B' is a monovalent cation of a lithium-6 isotope (i.e., $^6Li^+$).

21. The scintillator material of claim 20, wherein z is 0.002, 0.008, or 0.02.

22. The scintillator material of claim 20, wherein x is about 0.25.

23. The scintillator material of claim 20, wherein y is 0.004 or 0.012.

24. A radiation detector comprising a photon detector and a scintillator material of claim 20.

25. A method of detecting neutrons, wherein the method comprises: providing a radiation detector of claim 24; positioning the radiation detector, wherein the positioning comprises placing the radiation detector in a location wherein the scintillation material is in a path of a beam of neutron radiation or a suspected path of a beam of neutron radiation; and detecting light emitted by the scintillation material with the photon detector.

* * * * *

UNITED STATES PATENT AND TRADEMARK OFFICE
CERTIFICATE OF CORRECTION

PATENT NO. : 11,230,667 B2
APPLICATION NO. : 16/612534
DATED : January 25, 2022
INVENTOR(S) : Foster et al.

It is certified that error appears in the above-identified patent and that said Letters Patent is hereby corrected as shown below:

In the Claims

Column 22, Line 60, Claim 6, please replace --0.1.2%-- with --1.2%--.

Signed and Sealed this
Sixth Day of August, 2024

Katherine Kelly Vidal
*Director of the United States Patent and Trademark Office*